US011967118B1

(12) United States Patent
Brown et al.

(10) Patent No.: US 11,967,118 B1
(45) Date of Patent: Apr. 23, 2024

(54) HYBRID CODEC

(71) Applicant: Amazon Technologies, Inc., Seattle, WA (US)

(72) Inventors: Russell Allen Brown, Palo Alto, CA (US); Paolo Maggi, Alba (IT); Paolo Angelo Angelo Borelli, Casirate d'Adda (IT); Paul Hinks, San Rafael, CA (US); Mark John Keller, Sammamish, WA (US)

(73) Assignee: Amazon Technologies, Inc., Seattle, WA (US)

( * ) Notice: Subject to any disclaimer, the term of this patent is extended or adjusted under 35 U.S.C. 154(b) by 323 days.

(21) Appl. No.: 17/107,837

(22) Filed: Nov. 30, 2020

(51) Int. Cl.
| | |
|---|---|
| *G06T 9/00* | (2006.01) |
| *G06T 3/40* | (2006.01) |
| *G06T 7/13* | (2017.01) |
| *H03M 7/30* | (2006.01) |
| *H03M 7/40* | (2006.01) |

(52) U.S. Cl.
CPC .................. *G06T 9/00* (2013.01); *G06T 3/40* (2013.01); *G06T 7/13* (2017.01); *H03M 7/3064* (2013.01); G06T 2207/20021 (2013.01); *H03M 7/4075* (2013.01); *H03M 7/6005* (2013.01); *H03M 7/6011* (2013.01)

(58) Field of Classification Search
None
See application file for complete search history.

(56) References Cited

U.S. PATENT DOCUMENTS

| | | | | |
|---|---|---|---|---|
| 5,638,498 | A   * | 6/1997  | Tyler ...................... | G06T 9/005 |
| | | | | 358/1.18 |
| 6,633,242 | B2 | 10/2003 | Brown | |
| 11,290,710 | B1 * | 3/2022 | Brown ................... | G06T 11/001 |
| 11,350,085 | B2 * | 5/2022 | Abe ....................... | H04N 19/52 |
| 2005/0100230 | A1 * | 5/2005 | Moore ................. | H04N 19/176 |
| | | | | 382/232 |
| 2008/0144952 | A1 * | 6/2008 | Chen ...................... | H04N 19/93 |
| | | | | 375/E7.076 |
| 2011/0202584 | A1 | 8/2011 | Maurer | |
| 2013/0101025 | A1 * | 4/2013 | Van der Auwera .. | H04N 19/117 |
| | | | | 375/240.03 |

(Continued)

OTHER PUBLICATIONS

Tehola, "A Compression Method for Clustered Bit-Vactors," Department of Computer Science, University of Turku, Oct. 1978, 7(6):308-311.

(Continued)

*Primary Examiner* — Randolph I Chu
(74) *Attorney, Agent, or Firm* — Davis Wright Tremaine LLP

(57) ABSTRACT

Systems and methods are described herein for implementing a hybrid codec to compress and decompress image data using both lossy and lossless compression. In one example encoding process, it may be determined whether a first block of pixels of a frame of image data contains an edge. A type of compression by which to encode the first block may be selected based on that determination. The first block may be compressed using the selected type of compression. At least one second value associated with the first block of pixels may be set to indicate at least oof the compressed value or the type of compression used to compress the first block.

23 Claims, 19 Drawing Sheets

(56) References Cited

U.S. PATENT DOCUMENTS

| | | | |
|---|---|---|---|
| 2014/0226721 A1* | 8/2014 | Joshi | H04N 19/176 |
| | | | 375/240.12 |
| 2015/0012708 A1* | 1/2015 | Rubinstein | G06F 15/8015 |
| | | | 711/125 |
| 2015/0070371 A1* | 3/2015 | Poddar | G06T 11/001 |
| | | | 345/552 |
| 2018/0035126 A1* | 2/2018 | Lee | H04N 19/503 |

OTHER PUBLICATIONS

Richardson, "The H-264 Advanced Video Compression Standard," 2010, Second Edition, pp. 208-210.

Pennebaker et al., "Still Image Data Compression Standard," JPEG 1993, 20 pages.

Faugeras, "Digital Color Image Processing and Psychophysics Within the Framework of a Human Visual Model," Jun. 1976, 115 pages.

Malvar, et al., "Lifting-based reversible color transformations for image compression," Proceedings of SPIE, 2008, vol. 7073 707307, pp. 1-10.

Arai et al., "A Fast DCT-SQ Scheme for Images," The Transaction of the IEICE, Nov. 1988, 71(11):1095-1097.

Bhaskaran et al., "Image and Video Compression Standards— Algorithms and Architectures," The Kluwer International Series in Engeering and Computer Science, 1995, 373 pages.

Tang et al., "Lossy-to-Lossless Block-Based Compression of Hyperspectral Volumetric Data," 2004 Internation Conference on Image Processing (ICIP), 2004, 4 pages.

* cited by examiner

400

404

$y = a$
$y = b$
$y = c$
$y = (a+b)/2$
$y = a+b-c$
$y = a+(b-c)/2$
$y = b+(a-c)/2$
$y = c+(a-b)/2$

| b | x |
|---|---|
| c | a |

8-bit $[b \cdots c] \to z$ $[0 \cdots 0] \to 11$
$[1 \cdots 1] \to 10$
$[2 \cdots 3] \to 9$
$[4 \cdots 7] \to 8$
$[8 \cdots 15] \to 7$
$[16 \cdots 31] \to 6$
$[32 \cdots 63] \to 5$
$[64 \cdots 127] \to 4$
$[128 \cdots 255] \to 3$
$[256 \cdots 511] \to 2$
$[512 \cdots 1023] \to 1$
$[1024 \cdots 2047] \to 0$

1404

16-bit $[b \cdots c] \to z$ $[0 \cdots 0] \to 19$
$[1 \cdots 1] \to 18$
$[2 \cdots 3] \to 17$
$[4 \cdots 7] \to 16$
$[8 \cdots 15] \to 15$
$[16 \cdots 31] \to 14$
$[32 \cdots 63] \to 13$
$[64 \cdots 127] \to 12$
$[128 \cdots 255] \to 11$
$[256 \cdots 511] \to 10$
$[512 \cdots 1023] \to 9$
$[1024 \cdots 2047] \to 8$
$[2048 \cdots 4095] \to 7$
$[4096 \cdots 8191] \to 6$
$[8192 \cdots 16383] \to 5$
$[16384 \cdots 32767] \to 4$
$[32768 \cdots 65535] \to 3$
$[65536 \cdots 131071] \to 2$
$[131072 \cdots 262143] \to 1$
$[262144 \cdots 524287] \to 0$

FIG. 14

HYBRID CODEC

CROSS-REFERENCE TO RELATED APPLICATIONS

This application incorporates by reference for all purposes the full disclosures of U.S. patent application Ser. No. 17/107,835, now U.S. Pat. No. 11,290,710, filed concurrently herewith, entitled "ADAPTABLE GOLOMB CODING", and co-pending U.S. patent application Ser. No. 17/107,841, filed concurrently herewith, entitled "LOSSY BLOCK REPAIR".

BACKGROUND

Image and video data are being produced and consumed at an ever increasing rate. Various compression and encoding schemes have been developed to enable more efficient storage, transfer, and access to this data. Some compression and encoding schemes, generally referred to as lossless compression, retain all of the image data during the compression process, so that when decompressed, the resultant has the same fidelity as the original. However, lossless compression typically suffers from a low compression ratio, which can negatively affect the ability to stream images or video, particularly over low bandwidth network connections. Other compression techniques, referred to generally as lossy compression, truncate and reduce the size of the data in part by omitting some of the original data to produce a result that is close to, but not exactly the same as, the original. Consequently, images and video compressed using lossy compression often suffer from a loss of detail and sharp edges, which can be detrimental to the user experience. Some compression algorithms, such as those developed by the Joint Photographic Experts Group or (JPEG), support both types of compression, but not simultaneously for the same piece of image or video data. As a result, a choice must often be made between either a higher compression but lower image quality of a lossy compression technique or a lower compression but a higher image quality of a lossless compression.

BRIEF DESCRIPTION OF THE DRAWINGS

Various techniques will be described with reference to the drawings, in which:

FIG. 4 illustrates an example of a differential encoding or compression used in lossless or near lossless compression, according to at least one embodiment;

FIG. 14 illustrates an example lookup tables used for Golomb decoding, according to at least one embodiment;

DETAILED DESCRIPTION

Figure 1:
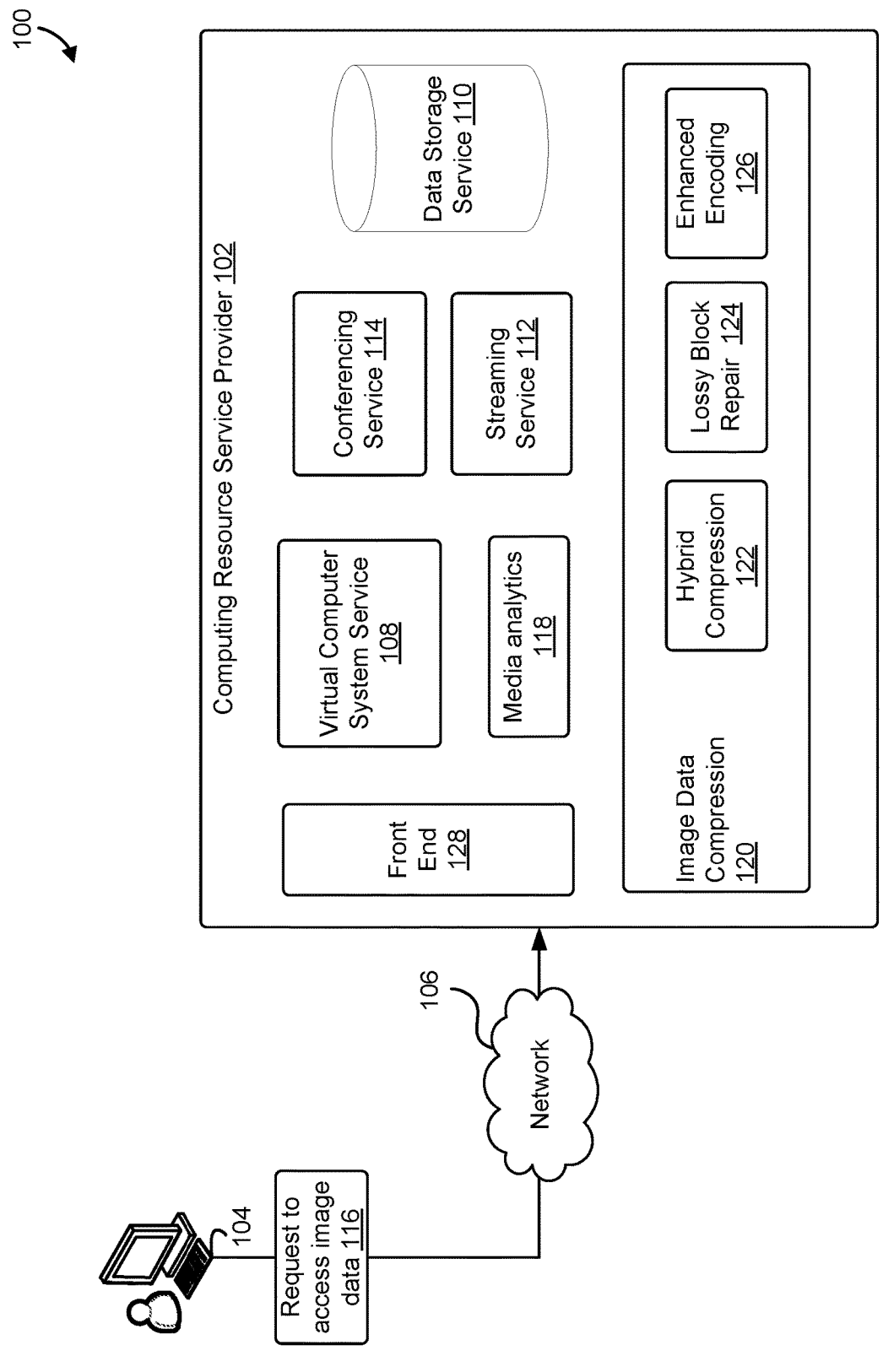
FIG. 1 illustrates an example environment in which the described techniques can be practiced, according to at least one embodiment.

Various systems and methods are described herein relating to image compression/decompression and image encoding/decoding. In a first aspect, systems and methods are described for implementing a hybrid codec to compress and decompress image data using both lossy and lossless compression. By selectively using lossless compression where detail is more important or more apparent, and using lossy compression where such detail is not present, overall image quality may be maintained while reducing the amount of data (and thereby reducing the bandwidth required to transmit the data) needed to represent the image or video. In one example, image data may be broken up into a number of blocks of pixels, and in some cases, the blocks of pixels may be uniform in size. The blocks of pixels may be analyzed to determine if they contain any edges, such as by using a Sobel operator or other detection technique. Blocks that do contain an edge may be compressed using a lossless compression technique, such as lossless JPEG. Blocks that do not contain an edge may be compressed using a lossy compression technique, such as discrete cosine transform (DCT). One or more values or indicators associated with each block may be set to indicate what type of compression was used for that block, so that the blocks may be decoded using the appropriate decompression technique. In some aspects, the value or indicator may include one or more bits in the bit stream produced as a result of the compression and/or encoding.

In some cases, the indicator used to indicate the type of compression used may also represent pixel information of the pixel blocks. In some cases, different values may be stored for lossy compression and lossless compression, whereby certain combinations of values may be used to indicate what type of compression was used for each block. In one specific example, which utilizes differential encoding techniques, for lossy compression, a previous column and previous row value may be stored, which indicate transformed pixel values for adjacent blocks. These values both set to 0 may indicate that the block was not compressed via lossy compression, but was instead compressed using lossless compression. Similarly, a block compressed via lossless compression may utilize 3 or more indicators associated with adjacent pixel blocks to be used in the lossless compression and decompression process. These values may indicate adjacent block pixel values used in lossless JPEG compression. In some cases, certain combinations of values for these indicators may indicate whether the block was compressed using lossy or lossless compression. In one example, each block may be associated with two indicators for lossy compression and three values for lossless compression. In some cases, these values may be determined, maintained, and updated by the encoder/decoder during the encoding and decoding processes. In this way, a more flexible and agile way of compressing and decompression image data using both lossy and lossy compression techniques may be provided.

Decompressing or decoding the hybrid compressed or encoded image data may follow a similar but reverse process, where the indicator value or values are used to select which process is used to decompress individual pixel blocks of the image. In some aspects, various color transformations, encoding modifications, and other processes may be combined with the lossy and lossless compression to provide higher compression ratios while still minimizing computational overhead.

In a second aspect, systems and methods are described for implementing a lossy block repair process that can "repair" lossily compressed pixel blocks in an image. In some cases, this lossy block repair process can be implemented in combination with the hybrid codec described above. In other cases, the lossy block repair may be implemented for any image data that is compressed or encoded via lossy encoding techniques. A pixel block that was encoded for a prior frame via lossy encoding and that is unchanged from the analogous pixel block of the immediately prior frame may be "repaired" by re-encoding that block via lossless encoding. This process may be useful for situations where certain pixel blocks for a background are encoded via lossy compression while a video camera is panning. As soon as the camera stops panning, the blocks of the background stop changing and at that point they may be re-encoded via lossless encoding.

In some examples, image data may be broken up into a number of pixels blocks, which may be of the same or different sizes and shapes. Individual blocks of the image data may be encoded or compressed using lossy techniques. The block or blocks that were encoded via lossy techniques may be identified, such as through one or more indicators associated with the individual blocks (such as via the indicators described above in reference to hybrid compression).

The lossily compressed pixel block may then be compared to a corresponding pixel block in a subsequent frame of the image data (e.g., video). If a comparison of the two blocks reveals little change between them, as for example when the sum of the absolute values of the difference between corresponding pixel value for the entire block is a below a threshold, that pixel block may be selected as a candidate for lossy block repair. The block may then be re-encoded using a lossless technique to improve image quality for the pixel block. In some cases, a counter may be introduced to cause a delay between detecting that a lossy block has not changed from a prior frame and the act of re-encoding or compressing the pixel block using a lossless technique. The counter may be used to ensure that a block that stays the same for only a few frames is not re-compressed using lossless compression, thus incurring more computational overhead and decreasing the compression ratio of the image data, to only improve image quality for a very short duration of time. In some cases, such as when lossy block repair is used in conjunction with hybrid compression techniques, one or more indicators may be maintained and updated to specify what type of compression, lossy or lossless, was used for individual pixel blocks of the image data. In some cases, the repaired pixel block may not be re-encoded in the future until it changes more than a certain amount.

In a third aspect, systems and methods are described for implementing an adaptive coding scheme that utilizes small, second lookup tables for encoding or decoding to increase the compression ratio via minimal additional computation. The adaptive encoding process may be utilized on its own to provide benefits, or may be used in conjunction with one or more of hybrid compression or lossy block repair to provide additional benefits.

In some cases, the described adaptive encoding technique may be used in conjunction with Golomb coding or exponential Golomb encoding (both referred to herein as simply Golomb encoding or coding). The Golomb coding scheme may be modified to enable a smaller lookup table or other data structure to be used for different types of color values for pixels of image data, including 8-bit and 16-bit color values, with minimal increase in computational overhead. In one example, the image data may be modified to enable the use of a smaller 8-bit color lookup table to be used both for encoding/decoding 8-bit color values and 16-bit color values.

In some examples, a color type associated with a value, such as a signed or unsigned integer representing pixel color value, of image data may be determined. The type may include 8-bit color values or 16-bit color values, for example. A length of the value may then be determined to enable encoding the value via the correct Golomb code. The length may be determined differently for a value that is determined to represent 8-bit color and a value that is determined to represent 16-bit color. In one specific example, the length of an 8-bit color value may be the number of bits required to represent an 8-bit integer, and the length of a 16-bit color value may be a modified number. Both lengths may then be used to map to a Golomb code that is used in representing the pixel information. In some cases, the mapping may include using an 8-bit color lookup table for both 16-bit and 8-bit color value lengths to obtain another value that is then combined with the integer value to produce a Golomb code for the pixel value. In some cases, the length value is used to determine a number of leading zeros or ones (or some other sentinel or designated value) that is prepended, or alternatively appended, to the integer to produce the Golomb code for that pixel value.

In some cases, a second adaptive lookup table or data structure may be used to determine a different number of zeros (or ones or other sentinel value) to append to the pixel value to generate the Golomb code for that pixel value. In some cases, the second lookup table may be configurable, and may be used to map the most frequently used or occurring pixel value (or estimated most occurring value) in the image data to the least number of prepended zeros or ones, to increase compression of the image data when using Golomb encoding. In some cases, the most frequently occurring value may be different for different types of compression, such as different types of lossy or lossless compression, or when used in a hybrid encoding scheme that can exploit differences between lossy and lossless compression. In yet some cases, a histogram of the most frequently used or occurring values in the compressed data may be observed and obtained. This histogram information may then be used to populate the adaptive lookup table or tables to map the least amount of zeros to the most frequently occurring values. In some cases, the aggressiveness of quantization used, such as for lossy compression, may correlate to the most frequently used values. This information may additionally or alternatively be used to populate the one or more adaptive lookup tables.

In these cases, two or more adaptive lookup tables or data structures may be utilized to further increase compression without any additional loss of image data that would cause loss in image quality. In cases where multiple adaptive lookup tables are used for image data, indicators, such as those described above for hybrid compression, may similarly be used to inform which lookup table to use for a given pixel block or other portion of image data. Decoding the image data bit stream may follow a similar process, whereby the process from encoded pixel values to image data may utilize similar operations on the data to map the values to color values contained in a smaller lookup table, such as an 8-bit color lookup table. As used herein, data compression refers to reducing the size of data, either through lossy ways in which some data is actually lost or truncated, or lossless ways, in which different formats are used to express the information without loss of that information. Encoding may be more broadly used to include a reinterpretation of data to another form or some form of translation. Encoding may include compression, but does not necessarily include it.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

As one skilled in the art will appreciate in light of this disclosure, certain embodiments may be capable of achieving certain advantages, including some or all of the following: (1) increasing compression for image data without losing perceivable image quality or fidelity, (2) increasing image quality with minimal affect to image data size or computational overhead, 3) decreasing memory usage to storage image data, and 4) decreasing bandwidth usage to send image data, among a number of other advantages and benefits that will be described throughout this disclosure.

FIG. 1 illustrates an example environment 100 in which an image data compression service 120 may be provided by a computing resource service provider 102. A client 104 may interact with the computing resource service provider 102 via a front end 128 of computing resource service provider 102 over one or more networks 106 to interact with various media and forms of image data or video, such as through one or more of a virtual computer system service 108, a data storage service 110, a streaming service 112, a media analytics service 118, and/or a conferencing service 114, as will be described in greater detail below.

Client 104 may refer to a client computer system or computing device connected to a server (e.g., computing resource service provider) over a network 106. In some cases, client 104 refers to a user or operator of a client computer system, and may be an employee of an organization that utilizes a computing resource service provider 102 to interact with various forms of media, such as through one or more of a virtual computer system service 108, a data storage service 110, a streaming service 112, a media analytics service 118, and/or a conferencing service 114.

Client 104 may submit a request 116 for access to various computing resources (e.g., services or computing resources thereof) of computing resource service provider 102. The request 116, in some examples, is a web service application programming interface request (also referred to simply as a web service request), may be received by a service of the computing resource service provider 102. As illustrated, the client 104 may submit a request 116 to access or interact with image data. The request 116 may be directed to one or more services provided by the computing resource service provider 102, and may include a request to access streaming media via a streaming service 112, store certain media with data storage service 110, perform one or more operations, modify, or obtain analytics on media via media analytics 118, conference with another user via a conferencing service 114, and so on.

In some cases, the front end 128 may receive the request and direct it to the appropriate service. The front end 128 may be a system including a set of web servers (e.g., a single web server or a set of web servers which may be managed by a load balancer) provided by the computing resource service provider 102. Web servers of the front end 128 may be configured to receive various requests and to process them according to one or more policies associated with the service. In at least one embodiment, client 104 uses client software that is configured to establish a client-server relationship with a service of a computing resource service provider 102. A client 104 may connect to a service via front end 128, which receives requests from clients and routes them to backend services. Front end 128 may interface with one or more of a virtual computer system service 108, a data storage service 110, a streaming service 112, a media analytics service 118, and/or a conferencing service 114 offered by a computing resource service provider 102 to its customers. In at least one embodiment, client 104 interacts with a GUI to interact with various media provided by or through the computing resource service provider 102, and client-side software translates the GUI setup to a web service API request which is transmitted from the client computer system 104 to front end 128 via a network 106. In an embodiment, the network 106 includes any appropriate network, including an intranet, the Internet, a cellular network, a local area network, a satellite network or any other such network and/or combination thereof, and components used for such a system depend at least in part upon the type of network and/or system selected. Many protocols and components for communicating via such a network are well known and will not be discussed herein in detail. In an embodiment, communication over the network 106 is enabled by wired and/or wireless connections and combinations thereof. In some cases, a network may include or refer specifically to a telephone network such as a public switched telephone network or plain old telephone service (POTS).

The computing resource service provider 102 may provide various services such as data processing, data storage, software applications, security, encryption, and/or other such services. A computing resource service provider described herein may be implemented using techniques described in FIG. 19. The computing resource service provider 102 may provide services that may be accessible through various software, hardware, and/or variations thereof. In some examples, the services may be implemented as software applications or services executing on various computing devices. Examples of such computing devices include one or more instances of a physical computing instance (e.g., a physical server computer, a mobile communication device, a laptop computer, a tablet computer, a personal computer, a mainframe, etc.) or one or more instances of a virtual computing instance, such as a virtual machine hosted on one or more computer servers, or other various capable computing systems.

In some examples, the computing resource service provider 102 may provide one or more of a virtual computer system service 108, a data storage service 110, a streaming service 112, a conferencing service 114, and/or a media analytics service 118. Each of these services may provide ways for a customer to interact with various forms of media. The storage, transfer and access of this media may be enhanced using an image data compression codec or service 120 as will be described in greater detail below.

As illustrated, the virtual computer system service 108 may be a collection of computing resources configured to instantiate virtual machine instances on behalf of the customer 104 directly or indirectly, such as through one or more other services 110, 112, 114, 118 provided by the computing resource service provider 102. The services 110, 112, 114, 118, (or customer 104 directly) may interact with the virtual computer system service 108 (via appropriately configured and authenticated API calls) to provision and operate virtual computer systems that are instantiated on physical computing devices hosted and operated by the computing resource service provider 102. The virtual computer systems may be used for various purposes, such as to operate as servers supporting data storage for a customer coupled with compute capabilities to search, query, access, and perform other operations on the customer data. Virtual computer system service 108 may configure compute instances to have various processing units and/or processing capabilities, various amounts of data storage, and so on. Although the virtual computer system service 108 is shown in FIG. 1, any other computer system or computer system service may be utilized in the computing resource service provider 102, such as a computer system or computer system service that does not employ virtualization or instantiation and instead provisions computing resources on dedicated or shared computers/servers and/or other physical devices.

In some examples, the computing resource service provider 102 may provide data storage through a data storage service 110 to store and manage large volumes of data, including image and other media data. In some cases, the data storage service 110 may interact with the image data compression codec or service 120 to more efficiently compress, encode, and store data, as will be described in greater detail below. Data storage service 110 may be an on-demand data storage service, such as an object-based data storage service, and may be configured to store various forms of media. The data storage service 110 may be implemented on a computer system, or abstraction thereof (such as one or more virtual machines, software containers, or other computing resource abstractions), implemented using hardware and software, and may comprise one or more processors and memory that stores executable instructions whose execution by the one or more processors causes the computer system to perform operations described herein.

The data stored in the data storage service 110 may be organized into data objects, in one or more logical data containers. The data objects may have arbitrary sizes and may, in some instances, have constraints on size. Thus, the data storage service 110 may store numerous data objects of varying sizes. The data storage service 110 may operate as a key value store that associates data objects with identifiers of the data objects which may be used by the client 104 to retrieve or perform other operations in connection with the data objects stored by the data storage service 110. Access to the object-based data storage service 110 may be through application programming interface (API) calls to the service or via an interface, such as a graphical user interface (GUI).

In some cases, the data storage service 110 may operate as a key value store that associates data objects with identifiers of the data objects which may be used by the client 104 to retrieve or perform other operations in connection with the data objects stored by the data storage service 110. Access to the data storage service 110 may be through application programming interface (API) calls to the service, for example from either directly from client 104, or via the computing resource service provider 102. It should be appreciated that the data storage service 110 may additionally or alternatively provide non-object based data storage, such as block data storage, table-oriented data storage, relational databases, file-based storage, and the like. However, for consistency and ease of reference, the described techniques will primarily be described in relation to object-based data storage systems. The data storage service 110 may also implement an archival system or process that stores certain data objects in different storage locations, devices, etc., for example, based on access to those data objects or other factors. For example, some data objects that have not been accessed for a certain period of time may be moved from a storage device or location (e.g., referred to herein generally as storage class) that provides prompt access, albeit at increased cost, to a more cost effective storage class that may provide access with some delay, different redundancy, or other attributes.

The streaming service 112 may include one or more computing resources that collectively operate to provide streaming content to client devices, such as client device 104, such as video, audio, and/or other types of content. In cases where the content includes image or video data (collectively referred to as image data), the streaming service 112 may interact with or utilize the image data compression codec or service 120 to compress image data prior to streaming to client device 104. Similarly, the client device 104 may utilize the image data compression codec to decompress or decode the image data sent by the streaming service 112.

Similarly, the conferencing service 114 may include one or more computing resources that collectively operate to provide conferencing services to client devices, such as one or more of video conferencing, text messaging, etc., to client device 104 In some cases, the conferencing service 112 may interact with the image data compression codec or service 120 to compress/decompress image data in communicating with client device 104.

The media analytics service 118 may include one or more computing resources that collectively operate to provide various functionality to enable clients to analyze and/or modify content, such as media content. In some cases, the media analytics service 118 may interact with the image data compression codec or service 120 to similarly compress/decompress image data in communicating with client device 104.

The image data compression codec or service 120 may interact with various image data to enable higher compression rates of the image data, better image quality or fidelity of the image data, or a combination thereof. As used herein, image quality may refer to level of accuracy in which different imaging systems capture, process, store, compress, transmit and display the signals that form an image. In some cases, image quality may refer to the weighted combination of all of the visually significant attributes of an image. In some cases, the image data compression service 120 may be a standalone service, such as may be provided by one or more computing resources of the computing resource service provider 102. In yet some cases, the processes and functionality of image data compression 120 may be provided across the computing resource service provider 102 as a codec that is used by the various services provided by the computing resource service provider 102 to enhance storage, access, and the transfer of image data to various client devices, such as client device 104. Similarly, the image data compression codec 120 may be utilized by the client device 104 to interact with media, through or independent of the computing resource service provider 102.

The image data compression service or codec 120 may provide various enhancements to image data encoding and compression through a hybrid compression codec or process 122, a lossy block repair codec or process 124, and/or an enhanced encoding process 126, each of which will be described in greater detail below. These processes 122, 124, 126, may be used in combination, or individually to provide better compression rates for image data, better image quality, or a combination thereof.

From a high level, the hybrid compression process or codec 122 provides for image data to be compressed using both lossy and lossless compression to enhance image data quality while reducing the data needed to provide the enhanced image quality, when compared to using only lossless compression for the entire image data. The hybrid compression process 122 may detect various features in image data, such as edges, to determine what type of compression to use for that specific portion of the image data. In some examples, the image data may be divided into a number of equal sized blocks containing the same number of pixels, such as a block size of an 8×8 square of pixels. The hybrid compression process 122 may maintain information indicating which blocks are compressed by which compression type, such as in the compressed or encoded data itself. This information may then be used by the receiver of the image data to decompress the image data accurately, using the correct type of decompression for the correct pixel block. In some cases, the compression type information may also be used for differential encoding to further increase the amount by which the image data is compressed. This process 122 may be useful for various image data applications, including video conferencing, streaming, and data storage.

The lossy block repair process 124 may repair certain portions or blocks of pixels in image data that were previously compressed using a lossy compression technique, by re-encoding the block of pixels using a lossless compression technique. Process 124 may include first determining that a pixel block in image data has not changed (or not changed substantially, such as by an amount below a threshold) between a first frame and a second frame of the image data. If that is the case, then the pixel block is re-encoded or compressed using a lossless compression to improve the quality of that pixel block. In some cases, a delay may be introduced, such that a pixel block may be repaired only after a certain number of frames have occurred, to decrease computational overhead in the case that a pixel block doesn't change for 1 or 2 frames, but then changes, thus negating some of the benefits of re-encoding that pixel block using lossless compression. This process 124 may be particularly useful in scenarios where certain parts of image data change infrequently, such as in video conferences scenarios, where the background may not change for longer periods of time. The lossy block repair process may be used on any image data that was compressed using a lossy technique, including but not limited to image data that is encoding using hybrid compression process 122.

The enhanced encoding process 126 may improve encoding of image data by eliminating the need to have large lookup tables to map higher bit color values, such as 16-bit color values to an encoding scheme. In some embodiments, process 126 may make small changes to known encoding processes, such as Golomb encoding, to utilize a smaller lookup table for mapping Golomb codes to color values. Process 126 may be useful in many encoding/decoding applications where Golomb encoding is used. This may include image data that is subject to one or both of process 122 and 124 described above.

Figure 2:
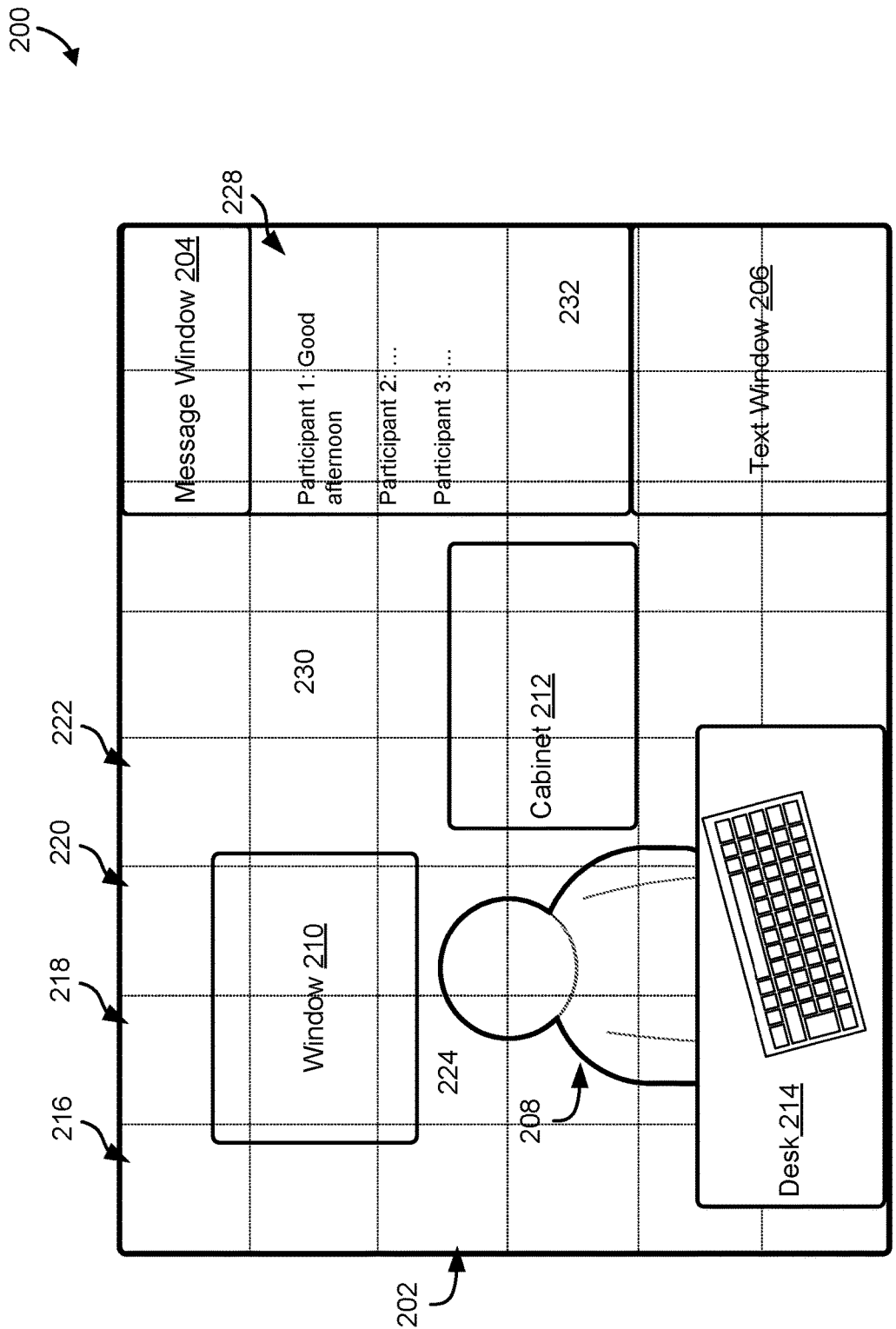
FIG. 2 illustrates an example video conference window in which the described techniques may be used.

FIG. 2 illustrates an example of image data representing a video conference window 200 in which the described techniques may be used. Conference window 200 includes a number of different areas, including a message window 204, a text window 206 and a video conference area 202. Window 200 is provided by way of illustrative example to show how different areas of image data can include different features that may benefit from a hybrid encoding scheme, such as a hybrid encoding process 122, lossy block repair process 124, and/or an enhanced encoding process 126 described above in reference to FIG. 1.

In the illustrated example, message window 204 and text window may include various lines of text, including messages sent between members of the video conference in message window 204 and administrative updates, for example, in an additional text window 206. The conference or video portion of window 200, indicated by area 202, may include video of a member 208 of the conference session and objects or features near the member 208, such as a desk 214, a cabinet 212, a window 210, and so on. Some of these features and areas may benefit from lossless encoding to enhance the resolution of the picture in those areas, whereas for other features and areas, less resolution, such as provided by lossy compression, may not provide any noticeable degradation in image quality. For example, text areas may benefit from higher resolution, whereas areas not filled by any definite objects may not benefit from a higher resolution. In these cases, it may be beneficial to compress portions of the image data with lossless compression and other parts with lossy compression, to provide an overall higher resolution image, thus avoiding the low compression ratio that results from using lossless compression for the entirety of the image data.

Using the described techniques, window 200 may be broken up into different pixel blocks 216, 218, 220, 222, and so on. In some cases, pixel blocks 216, 218, 220, 222, may be of a uniform size and shape, such as a square of 8 pixels by 8 pixels. However, it should be appreciated that other sizes and shapes of pixel blocks may similarly be used. In some cases, a different size of pixels blocks may be selected based on the image data itself. This may include selecting different sizes of pixel blocks to optimize capturing and compressing various features within the image data, based on the application or service displaying the image data, a device that may be capturing or displaying the image data, and/or based on other factors. In yet some cases, different sizes of pixel blocks may be selected to capture various features in the image data, such as a face of member 208, part or all of a text or message window 206, 204, and so on.

Each pixel block 216, 218, 220, 222 may be scanned or otherwise analyzed to determine if lossless or lossy compression should be used for that particular pixel block. In some aspects, edge detection, such as facilitated through various filters or operators, may be used to determine what type of compression should be used for a given pixel block. In this example, a pixel block where an edge is detected, such as pixel block 224 including part of member's face, or pixel block 228 including text, may be selected for lossless compression, whereas pixel blocks 230 and 232, which do not include any specific feature or object, may be selected for lossy compression.

In another example, window 200 may be used to illustrate a beneficial use of lossy block repair, such as described above in reference to FIG. 1. In this example, member 208 may move the camera that is capturing video conference window area 202 from one side to the other, such that the objects captured in area 202 move between different frames captured by the camera. In this example, a conferencing service, such as conferencing service 114 may have a configuration that dictates that while rapidly changing, at least part of the area 202 is encoding via lossy compression, to reduce the bandwidth required to transmit the image data. In this case, for example, pixel block may at first be compressed using lossy compression. Once the camera stops moving, and the member's 208 face is positioned in pixel block 224, it may be beneficial to re-encode that block using lossless encoding, to produce a higher quality image of the member's 208 face. Using the described lossy block repair techniques, once it is determined that a pixel block, which has been compressed using lossy block repair, has not changed for at least one frame, the pixel block may be re-encoded using lossless compression. This may beneficially increase the quality of that area of the image data to enhance the overall quality of the image data, without necessitating re-encoding all of the pixels in the image data. In some cases, a counter or other mechanism may be implemented to wait a certain number of frames to re-encode the pixel block. This may help ensure that computational resources are not put to waste, such as in the case where a block does not change for only a few frames, whereby re-encoding the block via lossless compression only enhances the image quality for a very short duration.

In the examples of both hybrid compression and lossy block repair, enhanced encoding, such as provided by the enhanced encoding process 126 described above in reference to FIG. 1, may be beneficially applied to further increase compression and decrease memory resources needed to encode and decode the compressed image data, as will be described in greater detail below.

Figure 3:
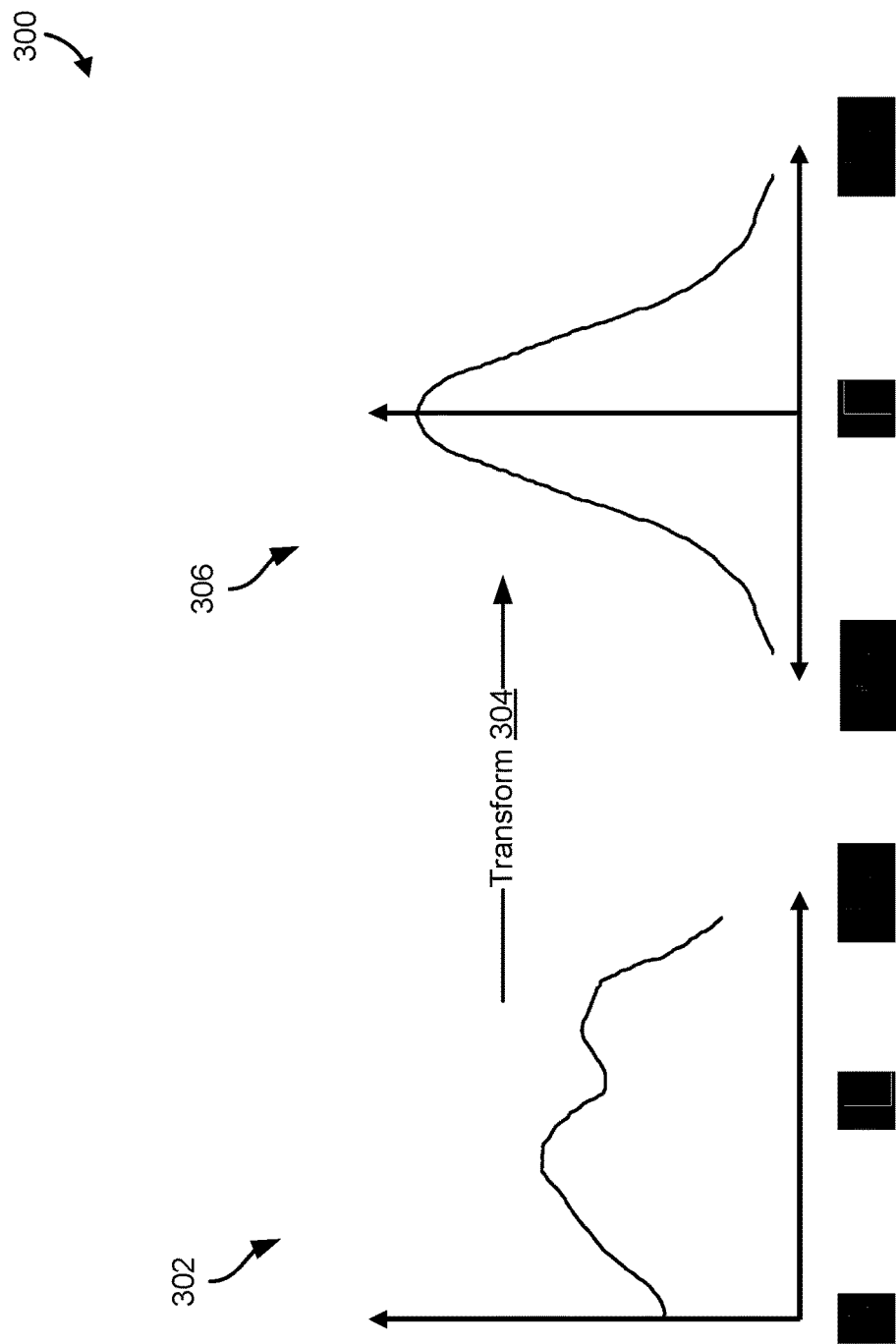
FIG. 3 illustrates an example diagram of a color transformation, according to at least one embodiment.

FIG. 3 illustrates an example diagram of a color transformation 300, which will be described to inform the techniques descried herein for hybrid compression, lossy block repair and enhanced or adaptive encoding. As illustrated, $X_i$ of graph 302 represents untransformed 8-bit pixel color values in the range [0, 255] and $Y_i$ of graph 306 represents transformed 9-bit pixel values in the range [−255, 255] after a transformation process 304. Whereas the untransformed pixel color values are distributed somewhat uniformly in the range [0, 255], the transformed pixel values cluster about zero. The more tightly the pixel values cluster about zero, the better, for the purposes of encoding.

Two methods for transforming the pixel color values so that they cluster about zero are (1) the discrete cosine transform (DCT) used in lossy JPEG compression and (2) differential or predictive coding used in lossless JPEG. The DCT converts pixel color values to spatial frequency amplitudes. The amplitudes of a typical natural image such as a photograph are larger for low frequencies due to a paucity of sharp edges in the image; hence, the amplitudes for low spatial frequencies that cluster about zero dominate in a natural image. The differential or predictive coding method achieves a similar result to the DCT because in predictive coding the transformed pixel values also cluster about zero.

Following transformation 304, the pixel values are represented in a format that requires fewer bits per pixel on average than the original pixel color format. FIG. 3 demonstrates that 0 is the most probable pixel value, ±1 are the next most probable values, ±2 are the next most probable values, etc. Hence, a format suitable for representing this distribution of pixel values would represent 0 with the fewest possible bits and then ±1, ±2, etc. with increasing numbers of bits. A format that satisfies these criteria and is used for JPEG image compression is Huffman coding. The alternative format shown below and used in H.264 compression is exponential-Golomb or exp-Golomb coding. Either format encodes a 9-bit pixel value in the range [−255, 255] using a lookup table of 2 9=512 entries. An advantage of exponential-Golomb coding relative to Huffman coding is that the Golomb codes may be reinterpreted easily, as will be discussed in greater detail below. The term "exponential-Golomb coding" is used interchangeably with the term "Golomb coding" in this disclosure. Shown below is an example of a Golomb encoding scheme:

0→1
+1→010
−1→011
+2→00100
−2→00101
+3→00110
−3→00111
+4→0001000
−4→0001001
+5→0001010
−5→0001011
+6→0001100
−6→0001101
+7→0001110
−7→0001111
+8→000010000
+15→000011110
−31→00000111111
+63→0000001111110
−127→000000011111111
+255→00000000111111110
−511→0000000001111111111
+1023→000000000011111111110
+2047→00000000000111111111110
−2047→00000000000111111111111

This Golomb coding scheme maps the most probable pixel value (0) to one bit (e.g., the fewest possible bits), the next most probable pixel values (±1) to three bits, the next most probable pixel values (±2 or ±3) to five bits, etc. Assuming that the transformed pixel values cluster tightly about zero as depicted in FIG. 3, Golomb coding requires on average fewer bits per pixel than representing the 9-bit pixel values via the integers [−255, 255]. Image compression generally minimizes the bit representation via entropy coding such as Golomb or Huffman coding. It should be appreciated that various features of the described systems and methods may be beneficially utilized with other types of encoding as well, beyond Golomb of Huffman encoding.

The Golomb codes presented above are interpreted as follows. The number of 0 bits that precede the leftmost 1 (i.e., the zero-prefix) equals the number of unsigned binary bits (including the 1) that follow the zero-prefix. The sign bit is the rightmost bit or LSB that follows the unsigned binary bits. The number of 0 bits in the zero-prefix is obtained via a lookup table. Lossless JPEG compression of 8-bit pixel color values in the range [0, 255] produces 9-bit integers in the range [−255, 255] that require a lookup table of $2^9$=512 entries. Lossy JPEG compression of 8-bit pixel color values in the range [0, 255] and 16-bit pixel color values in the range [0, 65535] may share a lookup table of $2^{11}$=2,048 entries because the zero-prefix contains only zeros. In some cases, a one-prefix, such as the number of 1 bits that precede the leftmost 0, may indicate the number of unsigned binary bits that follow the one-prefix, is an alternative implementation.

FIG. 4 illustrates an example 400 of a differential encoding or compression used in lossless or near lossless compression. In some examples, for lossless JPEG, a differential residual value r may be computed as r=x−y, where y is one of the 8 equations 404; x of block 402 is the color value of the current pixel; and a, b, and c of block 402 are the color values of adjacent pixels from the current or previous row of the image. One of the 8 equations 404 will predict the color values in a block of pixels more accurately than the other 7 equations, where the measure of accuracy is the sum of the absolute values of the residuals r for all pixels in the block. In one example, the pixel block may be selected as an 8×8 pixel block; however other sizes and shapes of pixel blocks may similarly be used.

When the most accurate equation has been identified for the block, each pixel color value x may be transformed into a residual value by replacing x with the residual value r that was computed via the most accurate equation. Assuming that the most accurate equation computes y values that are close to the pixel color values x, the transformed pixel values r will cluster tightly about zero. These transformed values r may be Golomb coded instead of Golomb coding the pixel color values x. Golomb coding the transformed values r requires on average fewer bits per pixel than Golomb coding the pixel color values x that are represented integers in the ranges [0, 255] or [0, 65535].

In some examples a "Lossless JPEG on Steroids" encoding scheme may be used. In this scheme, the 8th equation (y=c+((a−b))/2) of 404 deprecates the y=0 equation of lossless JPEG that is not general because it computes the residual value r using one particular value (0). In contrast, the 8th equation of 404 computes the residual value r via a linear combination of the adjacent pixel values a, b, and c, thereby preserving generality and also creates symmetry with the 6th equation (y=a+((b−c))/2) and 7th equation (y=b+((a−c))/2) of 404 that are identical to those of lossless JPEG.

An improvement to the lossless JPEG algorithm tests whether each pixel color value in the pixel block equals the pixel color value from the same position in the pixel block of the previous image in a sequence of images. If the color value of each pixel in the block equals the color value of the pixel from the same position in the previous pixel block, a 1-bit code is output to indicate equality of the two blocks and it is unnecessary to compute the residuals r for each of the pixels x of the block, thus eliminating significant computation.

A second improvement tests whether all pixel color values in the block equal one another. If so, computing the residuals r is unnecessary for the block. Instead, a 1-bit is output to indicate equality and then the value of one pixel from the block is output. And in fact, in order to increase the probability that the value output is close to zero, the difference between the top left pixel of the block and the adjacent pixel immediately to the left of the top left pixel is output. This difference is a form of differential coding.

Even if the above two tests fail and it becomes necessary to compute the residuals r for the block, it is often unnecessary to output all residuals for the block. For example, if all of the residuals r from a given pixel row of the block equaled zero, the Golomb coding scheme would represent each zero residual via a 1-bit code equal to 1, so an 8-bit code of 11111111 would be output for that all-zero row in an 8×8 block of pixels. However, it is possible to achieve better compression through the use of an 8-bit mask wherein each bit specifies a particular row for which all residuals r equal zero. Below is an 8×8 block wherein rows 1, 4, and 7 contain all-zero residuals.

$$\begin{bmatrix} 5 & -3 & -2 & 7 & 0 & 3 & 11 & 2 \\ 0 & 0 & 0 & 0 & 0 & 0 & 0 & 0 \\ 4 & 2 & 0 & -1 & 9 & -2 & -7 & 0 \\ 6 & 0 & -4 & 13 & 3 & -1 & -5 & 7 \\ 0 & 0 & 0 & 0 & 0 & 0 & 0 & 0 \\ 0 & 9 & -8 & -2 & 3 & -1 & 5 & -3 \\ 6 & -2 & 5 & 0 & 0 & 7 & -9 & 1 \\ 0 & 0 & 0 & 0 & 0 & 0 & 0 & 0 \end{bmatrix}$$

For this block, a 1-bit code is output to specify that an 8-bit mask follows, then an 8-bit mask of 01001001 is output, then the Golomb codes for the residuals r in rows 0, 2, 3, 5, and 6 are output. The 8-bit mask obviates the 8-bit codes equal to 11111111 for each of the three rows 1, 4, and 7. These three improvements extend the lossless JPEG codec to create a "lossless JPEG on steroids" (LJoS) codec that enjoys an increased compression ratio due to the improvements.

Image compression algorithms (including JPEG) may transform the pixel color values from (R,G,B) space into $(Y,C_b,C_r)$ space prior to encoding and then re-transform the pixel color values back into (R,G,B) space after decoding. The impetus for these transformations is twofold.

First, human color vision transforms (R,G,B) information into information similar to $(Y,C_b,C_r)$, where Y represents achromatic information (or luminance) and $C_b$ and $C_r$ represent chromatic information (or chrominance). Human vision is more sensitive to Y than $C_b$ or $C_r$ and image compression algorithms exploit this feature of human vision. Second, (R,G,B) space contains redundant information that transformation into $(Y,C_b,C_r)$ space removes, thereby permitting image compression algorithms to achieve higher compression ratios in $(Y,C_b,C_r)$ space than in (R,G,B) space.

The transformation of 8-bit (R,G,B) values into 8-bit $(Y,C_b,C_r)$ values occurs as follows:

$$\begin{bmatrix} Y \\ C_b \\ C_r \end{bmatrix} = \begin{bmatrix} 0.299 & 0.587 & 0.114 \\ -0.16874 & -0.33126 & 0.5 \\ 0.5 & -0.41869 & -0.08131 \end{bmatrix} \times \begin{bmatrix} R \\ G \\ B \end{bmatrix} + \begin{bmatrix} 0.5 \\ 0.5 \\ 0.5 \end{bmatrix} + \begin{bmatrix} 0 \\ 128 \\ 128 \end{bmatrix}$$

The transformation of 8-bit $(Y,C_b,C_r)$ values back into 8-bit (R,G,B) values occurs as follows.

$$\begin{bmatrix} R \\ G \\ B \end{bmatrix} = \begin{bmatrix} 1.0 & 0.0 & 1.4021 \\ 1.0 & -0.34414 & -0.71414 \\ 1.0 & 1.7718 & 0.0 \end{bmatrix} \times \begin{bmatrix} Y \\ C_b - 128 \\ C_r - 128 \end{bmatrix} + \begin{bmatrix} 0.5 \\ 0.5 \\ 0.5 \end{bmatrix}$$

In principle, the above transformations are lossless. In practice, integer arithmetic introduces truncation errors into the 8-bit color values. For this reason, the fast JPEG codec provides the option to avoid color-space transformation so that the pre-encode image may be compared to the post-decode image in order to ascertain whether the codec is bit-for-bit lossless. It is. Alternatives to $(Y,C_b,C_r)$ space are the $(Y,C_o,C_g)$ and Karhunen-Loève $(Y,C_1,C_2)$ spaces [13], as will be described below.

Human vision does not perceive light intensity; instead, it perceives the logarithm of intensity, also known as density. This behavior may be exploited by taking the logarithm of the 8-bit Y, $C_b$, and $C_r$ intensity values to produce density values prior to encoding and then taking the anti-logarithm of the density values to produce intensity values after decoding.

The base of the logarithm may be chosen carefully to avoid creating differences in light intensity that humans are capable of perceiving; otherwise, the logarithmic transformation may produce visually detectable artifacts. Numerous experiments suggest that a log base of 1.019 or less avoids visual artifacts. 8-bit density values are obtained from 8-bit intensity values as follows.

$$D = D_{max} + \log_{1.019}\left(\frac{I}{I_{max}}\right) = D_{max} + \frac{\ln\left(\frac{I}{I_{max}}\right)}{\ln(1.019)}$$

Where I represents an intensity value, D represents a density value, and for 8-bit color values $I_{max} = D_{max} = 255$ The above equation produces negative values of D for small values of I. These negative values may be set to zero so that all values of D are confined to the range [0, 255].

8-bit intensity values are recovered from 8-bit density values as follows.

$$I = I_{max}\frac{1.019^D}{1.019^{D_{max}}} = I_{max}\frac{e^{D\ln(1.019)}}{e^{D_{max}\ln(1.019)}}$$

For 8-bit pixel color values, the above equations may be implemented as two lookup tables, each having $2^8=256$ 8-bit entries. For 16-bit pixel color values, the lookup tables are not implemented only because each lookup table requires $2^{16}=65,536$ 16-bit entries.

Transformation from intensity to density as described above increases the compression ratio by 25 percent and increases the encode and decode performance by 10 percent. However, due to the limited dynamic range of 8-bit values, the logarithmic and anti-logarithmic transformations are not lossless. Nevertheless, using a log base less than 1.019 renders the loss imperceptible.

In some cases, the described techniques may utilize the Fast JPEG codec, which is capable of execution in multi-threaded mode for both encoding and decoding. Multi-threaded execution is achieved by two means. First, each Y, $C_b$, and $C_r$ color component is stored in a separate array and treated as a separate image that may be encoded or decoded by a separate thread. Second, each color component may be subdivided into a number of non-overlapping horizontal strips, each of which is processed by a separate thread. This may improve computational time to compress and decompress the image data, and so may be beneficially employed with the described hybrid encoding, lossy block repair, and/or adaptive encoding techniques.

For 8-bit color, the Golomb codes encode the range [−2047, 2047] in lieu of the range [−255, 255] to enable their use for lossy JPEG compression. In one example, the 64 8-bit pixel color values in an 8×8 block are transformed via the discrete cosine transform (DCT) to create 12-bit spatial frequency amplitudes that cluster about zero. These spatial frequency amplitudes may be Golomb coded to achieve a 3-to-1 compression ratio. However, apart from truncation errors introduced by integer arithmetic, the DCT is lossless and represents only the first step of lossy JPEG compression. The lossy compression techniques described below achieve significantly larger compression ratios.

For lossy compression, larger than 3-to-1 compression ratios may be obtained by quantizing the spatial frequency amplitudes. Quantization is achieved by dividing each amplitude of an 8×8 block by the corresponding quantization value from one of the two 8×8 quantization matrices shown below. The Y matrix is used to quantize luminance spatial frequency amplitudes and the $C_b$ or $C_r$ matrix is used to quantize chrominance spatial frequency amplitudes.

$$Y = \begin{bmatrix} 16 & 11 & 10 & 16 & 24 & 40 & 51 & 61 \\ 12 & 12 & 14 & 19 & 26 & 58 & 60 & 55 \\ 14 & 13 & 16 & 24 & 40 & 57 & 69 & 56 \\ 14 & 17 & 22 & 29 & 51 & 87 & 80 & 62 \\ 18 & 22 & 37 & 56 & 68 & 109 & 103 & 77 \\ 24 & 35 & 55 & 64 & 81 & 104 & 113 & 92 \\ 49 & 64 & 78 & 87 & 103 & 121 & 120 & 101 \\ 72 & 92 & 95 & 98 & 112 & 100 & 103 & 99 \end{bmatrix}$$

$$C_b = C_r = \begin{bmatrix} 17 & 18 & 24 & 47 & 99 & 99 & 99 & 99 \\ 18 & 21 & 26 & 66 & 99 & 99 & 99 & 99 \\ 24 & 26 & 56 & 99 & 99 & 99 & 99 & 99 \\ 47 & 66 & 99 & 99 & 99 & 99 & 99 & 99 \\ 99 & 99 & 99 & 99 & 99 & 99 & 99 & 9 \\ 99 & 99 & 99 & 99 & 99 & 99 & 99 & 99 \\ 99 & 99 & 99 & 99 & 99 & 99 & 99 & 99 \\ 99 & 99 & 99 & 99 & 99 & 99 & 99 & 99 \end{bmatrix}$$

The elements of these quantization matrices provide important insights into the operation of JPEG quantization. First, the elements of the luminance quantization matrix generally increase from top left ($Y_{00}$) to bottom right ($Y_{77}$). Because of this feature, quantization diminishes the amplitudes of higher spatial frequencies to a greater extent than it diminishes the amplitudes of lower spatial frequencies, so overly quantized JPEG images lose resolution and appear blurry.

Second, the elements of the chrominance ($C_b$ or $C_r$) quantization matrix increase more rapidly from top left to bottom right than do the elements of the luminance (Y) matrix. This more rapid increase exploits the fact that human vision is less sensitive to changes in adjacent chrominance values than to changes in adjacent luminance values. Due to the relative insensitivity of human vision to chrominance, the $C_b$ and $C_r$ amplitudes may be quantized more aggressively than the Y amplitudes. JPEG exploits this insensitivity via chrominance sub-sampling, which is described in more detail below.

Quantization coerces the amplitudes of the higher spatial frequencies to zero. Division achieves this aim via integer arithmetic. More aggressive or less aggressive quantization is respectively obtained by multiplying or dividing the Y and $C_b$ or $C_r$ matrices by an integer factor typically in the range. The block 502 illustrated in FIG. 5 was produced by dividing each element of the block X shown below by the corresponding element of the above luminance quantization matrix Y multiplied by an integer factor of 1, which achieves default JPEG quantization.

$$X = \begin{bmatrix} 97 & 49 & -3 & 20 & -10 & -1 & 1 & -6 \\ 34 & -25 & 6 & 13 & 5 & -3 & 15 & -6 \\ -6 & -4 & 8 & -9 & 3 & -3 & 5 & 10 \\ 8 & -10 & 4 & 4 & -15 & 10 & 6 & 6 \\ -12 & 5 & -1 & -2 & -15 & 9 & -5 & -1 \\ 5 & 9 & -8 & 3 & 4 & -7 & -14 & 2 \\ 2 & -2 & 3 & -1 & 1 & 3 & -3 & -4 \\ -1 & 1 & 0 & 2 & 3 & -2 & -4 & -2 \end{bmatrix}$$

$$Z = \begin{bmatrix} 6 & 4 & 0 & 1 & 0 & 0 & 0 & 0 \\ 3 & -2 & 0 & 1 & 0 & 0 & 0 & 0 \\ 0 & 0 & 1 & 0 & 0 & 0 & 0 & 0 \\ 1 & -1 & 0 & 0 & 0 & 0 & 0 & 0 \\ -1 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}$$

Block Z represents the quantized version of block X. To create block Z, each element of block X is divided by the corresponding element of matrix Y after first rounding by adding/subtracting one-half of the element of matrix Y to/from the element of block X, depending on the sign of the element of block X. For example, $Z_{10}$ and $Z_{40}$ are computed as:

$$Z_{10} = \left\lfloor \frac{X_{10} + \frac{Y_{10}}{2}}{Y_{10}} \right\rfloor = \left\lfloor \frac{34+6}{12} \right\rfloor = 3$$

$$Z_{40} = \left\lfloor \frac{X_{40} - \frac{Y_{40}}{2}}{Y_{40}} \right\rfloor = \left\lfloor \frac{-12-9}{18} \right\rfloor = -1$$

where $\lfloor x \rfloor$ represents the "floor" operator that truncates to the nearest integer from below to produce the largest integer that is less than or equal to x [13].

Block Z demonstrates that quantization creates numerous spatial frequency amplitudes that equal zero in the lower-right region of the 8×8 block, which is the aim of quantization. This all-zero lower-right region is exploited by the zig-zag algorithm to increase the compression ratio.

Figure 5:
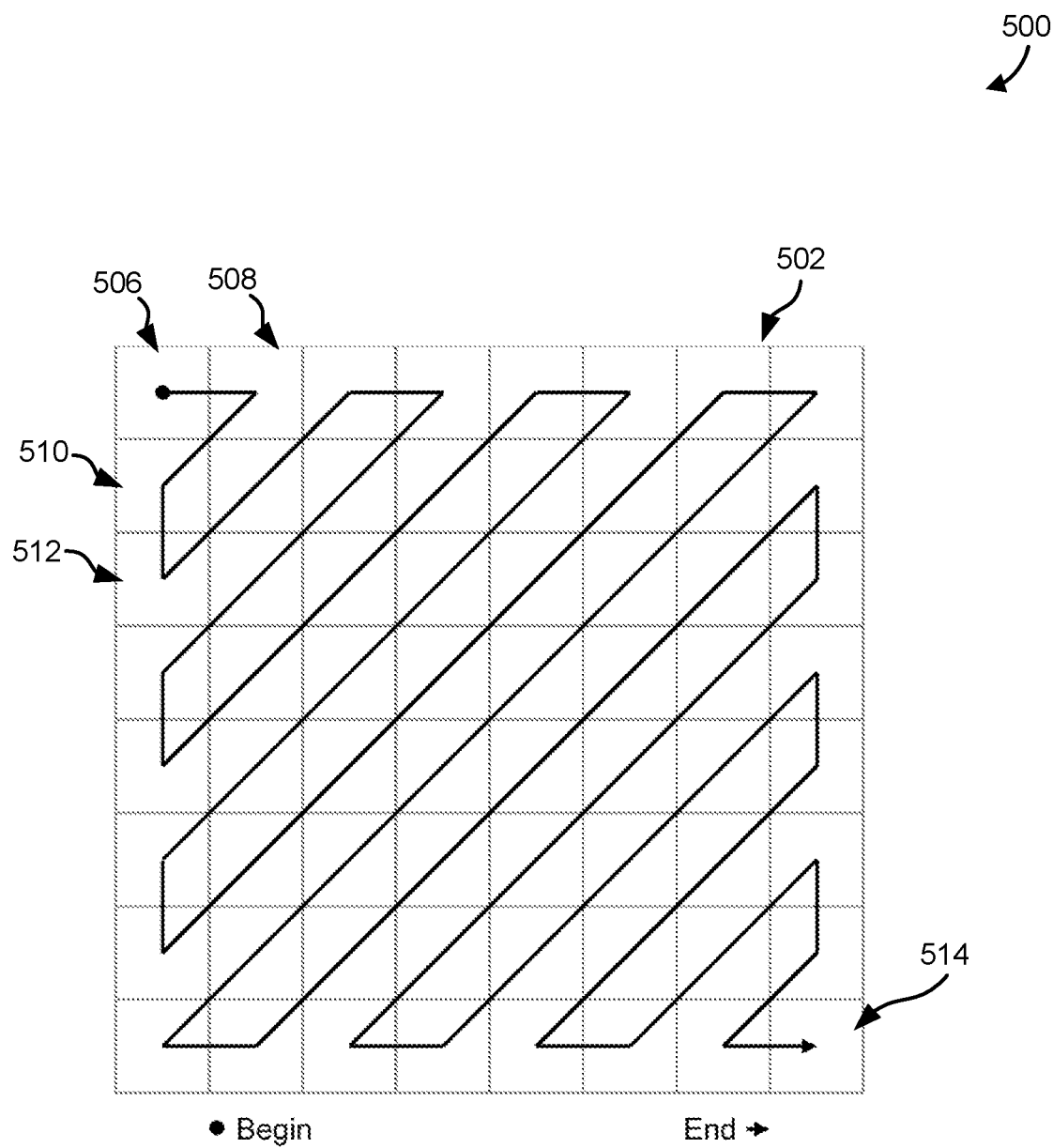
FIG. 5 illustrates an example diagram representing zig-zag scanning, which may be used in quantization processes to compress image data, according to at least one embodiment.

The quantized spatial frequency amplitudes are not scanned in row-major order but instead are scanned in zig-zag order, as illustrated in diagram 500 of FIG. 5. Zig-zag order increases the compression ratio because numerous, contiguous spatial frequency amplitudes that are all quantized to zero occur in the lower-right region of the 8×8 block; for example, see block Z above. Scanning the spatial frequency amplitudes, beginning with the top-left element ($Z_{00}$) of block Z and proceeding in zig-zag order to the bottom-right element ($Z_{77}$) of block Z, identifies the lower-right region of the block where all of the spatial frequency amplitudes equal zero. This and other properties of zig-zag scanning increase the compression ratio and are discussed below in conjunction with FIG. 500 that depicts zig-zag scanning that begins with element $Z_{00}$ and ends with element $Z_{77}$.

Zig-zag order, as depicted in FIG. 5, starts scanning block 502 beginning with cell 506 in the upper left hand corner. Next, cell 508 to the right is read, followed by cell 510 to the diagonal lower left. Continuing with the zig zag pattern, cell 512 below cell 510 is then scanned, with the next cell scanning moving in an upward diagonal order. This order continues until the lower right hand corner of the block 502, cell 514, is reached. Scanning block Z, illustrated above, in zig-zag order yields 14 amplitudes (6, 4, 3, 0, −2, 0, 1, 0, 0, 1, −1, −1, 1, 1) followed by a lower-right region that comprises 50 contiguous zero amplitudes. Each of the 10 non-zero amplitudes (6, 4, 3, −2, 1, 1, −1, −1, 1, 1) of the first 14 amplitudes may be Golomb coded and output along with a Golomb code that represents the number of zero amplitudes that precede it. The 10 non-zero amplitudes and their associated numbers of preceding zero amplitudes form the nine pairs (0, 6; 0, 4; 0, 3; 1, −2; 1, 1; 2, 1; 0, −1; 0, −1; 0, 1; 0, 1). Both values of each pair, e.g., 0 and 6 of the (0, 6) pair, are Golomb coded and output. Because the number of preceding zero amplitudes is a positive number, it is Golomb coded using an unsigned Golomb code that has no LSB sign bit, which increases the compression ratio. The 50 zero amplitudes are not output; rather, a special end-of-block (EOB) code that is the Golomb codes for the pair (0, 0) is output.

Summing the bit lengths of the Golomb codes for the 11 pairs (including the EOB code) results in 59 bits for block Z. Golomb coding in row-major order instead of zig-zag order uses 93 bits. Golomb coding in row-major order but using an 8-bit mask to specify that the last three rows contain all zeros requires 78 bits. And 64 8-bit pixel color values require 512 bits, so DCT, quantization, zig-zag, and Golomb coding achieve a compression ratio of 512/59=8.7-to-1.

JPEG employs one further optimization. $Z_{00}$ is the direct current (DC) component of the amplitudes that correlates strongly with the DC components of adjacent blocks. This component is not Golomb coded directly; instead, the difference between this DC component and the DC component of an adjacent block is Golomb encoded and decoded via differential coding.

As mentioned earlier, human vision is less sensitive to chrominance than it is to luminance. Broadcast television has exploited this insensitivity for decades by transmitting luminance at full resolution but transmitting chrominance at ¼ resolution or less. JPEG employs a similar strategy via down-sampling the chrominance color components $C_b$ and $C_r$ by a factor of two in both dimensions, which produces 1 pixel for each 2×2 block of pixels, reduces the encode and decode computation by 50 percent, and increases the compression ratio by 40 percent.

The standard algorithm for computing the DCT of an 8×8 block of pixel colors requires 1,024 multiply-accumulate operations. In some cases, performance may be significantly improved by using a fast algorithm that requires only 464 additions, 80 multiplies, and 4 shifts to compute the DCT. Computational performance may be increased by avoiding the division required for quantization and instead quantizing via multiplication by a pre-computed reciprocal. Performance may be further increased by avoiding floating-point arithmetic and instead representing fractions in fixed point. An improvement to the lossy JPEG algorithm tests whether the color value each pixel in the 8×8 block equals the color value of the pixel from the same position in the previous block and if so, eliminates the DCT computation.

In some cases, it is possible to use the Karhunen-Loève transform for conversion from (R,G,B) to (Y,C$_1$,C$_2$) instead of to (Y,C$_b$,C$_r$) as shown below for 8-bit (R,G,B) and (Y,C$_1$,C$_2$) values and thereby improve the compression ratio:

$$\begin{bmatrix} Y \\ C_1 \\ C_2 \end{bmatrix} = \begin{bmatrix} 1/3 & 1/3 & 1/3 \\ 1/2 & 0 & -1/2 \\ -1/4 & 1/2 & -1/4 \end{bmatrix} \times \begin{bmatrix} R \\ G \\ B \end{bmatrix} + \begin{bmatrix} 1/2 \\ 1/2 \\ 1/2 \end{bmatrix} + \begin{bmatrix} 0 \\ 128 \\ 128 \end{bmatrix}$$

The transformation of 8-bit (Y,C$_1$,C$_2$) values back to 8-bit (R,G,B) values occurs as follows:

$$\begin{bmatrix} R \\ G \\ B \end{bmatrix} = \begin{bmatrix} 1 & 1 & -2/3 \\ 1 & 0 & 4/3 \\ 1 & -1 & -2/3 \end{bmatrix} \times \begin{bmatrix} Y \\ C_1 - 128 \\ C_2 - 128 \end{bmatrix} + \begin{bmatrix} 1/2 \\ 1/2 \\ 1/2 \end{bmatrix}$$

It is also possible to transform from (R,G,B) to (Y,C$_o$,C$_g$) instead of to (Y,C$_b$,C$_r$) as shown below for 8-bit (R,G,B) and (Y,C$_o$,C$_g$) values and thereby improve the compression ratio:

$$\begin{bmatrix} Y \\ C_o \\ C_g \end{bmatrix} = \begin{bmatrix} 1/4 & 1/2 & 1/4 \\ 1/2 & 0 & -1/2 \\ -1/4 & 1/2 & -1/4 \end{bmatrix} \times \begin{bmatrix} R \\ G \\ B \end{bmatrix} + \begin{bmatrix} 1/2 \\ 1/2 \\ 1/2 \end{bmatrix} + \begin{bmatrix} 0 \\ 128 \\ 128 \end{bmatrix}$$

The transformation of 8-bit (Y,C$_o$,C$_g$) values back to 8-bit (R,G,B) values occurs as follows:

$$\begin{bmatrix} R \\ G \\ B \end{bmatrix} = \begin{bmatrix} 1 & 1 & -1 \\ 1 & 0 & 1 \\ 1 & -1 & -1 \end{bmatrix} \times \begin{bmatrix} Y \\ C_o - 128 \\ C_g - 128 \end{bmatrix} + \begin{bmatrix} 1/2 \\ 1/2 \\ 1/2 \end{bmatrix}$$

In contrast to the Karhunen-Loève (Y,C$_1$,C$_2$) transformation, the (Y,C$_o$,C$_g$) transformation uses no multiplication but the (Y,C$_o$,C$_g$) transformation achieves a slightly lower compression ratio than the (Y,C$_1$,C$_2$) transformation.

Transformation for 8-bit (R,G,B) requires an offset of 128. The transformation for 16-bit (R,G,B) requires an offset of 32768.

Any (or none) of the above color transformations may be utilized with one or more of the techniques described herein, such as hybrid compression, lossy block repair, and/or adaptive encoding), to further increase compression while reducing the degradation to image quality.

As described above lossy and lossless compression may utilize various features and sub-processes to increase compression while minimizing the negative affects to image quality. As described herein, the use of lossy compression may include one or more of the above described features, such as including one or more of color transformation, chrominance sub-sampling, and optimizing JPEG using a test to determine if all pixels in a block are all the same as a prior corresponding pixel block, and indicating such in a more bit efficient way, performing quantization, and/or using differential encoding. Similarly, lossless compression, as used herein may include one or more of the above described features, such as including one or more of the above described features, such as including one or more of color transformation or optimizing JPEG using a test to determine if all pixels in a block are all the same as a prior corresponding pixel block, and indicating such in a more bit efficient way, and/or using differential encoding.

Figure 6:
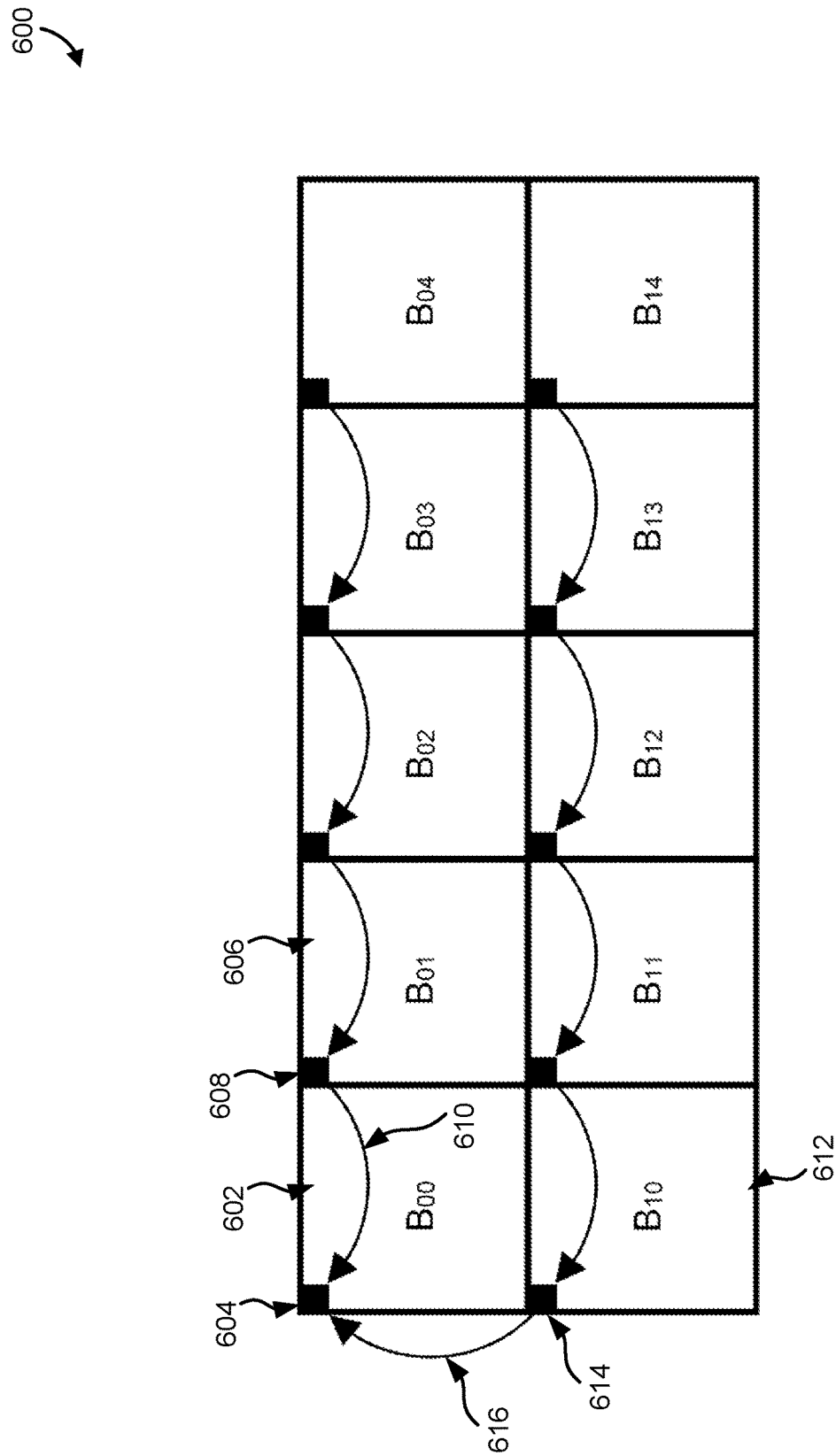
FIG. 6 illustrates an example diagram of a number of pixel blocks of image data, according to at least one embodiment.

FIG. 6 illustrates an example diagram of a number of pixel blocks 602, 606, 612 of image data 600. In some cases, lossy and lossless JPEG compression use information from adjacent blocks. For lossy JPEG compression, the zig-zag algorithm may be used to encode the DC component (Z$_{00}$) of the spatial frequency amplitudes via differential coding. Differential encoding subtracts the DC component of an adjacent block from the DC component of the block currently being encoded, as depicted by arrow 610 between DC component 608 of block B01 606 and DC component 604 of block B00 602 in FIG. 6. The black squares of FIG. 6 604, 608, and 614 represent the DC components. The arrows 610 and 616 represent subtraction wherein the DC component at the tip of the arrow is subtracted from the DC component at the blunt end of the arrow. Lossy decoding similarly uses differential coding.

In some implementations, the rows of 8×8 blocks within an image are encoded sequentially from top to bottom and the blocks within each row are encoded sequentially from left to right. Given this pattern, sequential encoding maintains two DC components for adjacent blocks: the DC component for the block immediately to the left of the block currently being encoded (stored as prevColDCFreq) and, if the block currently being encoded lies at the left edge of the image, the DC component for the block immediately above the block currently being encoded (stored as prevRowDCFreq). In the example illustrated, prevColDCFreq for block B01 606 would be the DC component 604, and revRowDCFreq for block B10 612 would be DC component 604.

An encoding example illustrates the use of these two DC components. Both components are initialized to 0. Encoding may begin with the upper left block of the image (B00) 602. No block exists above or to the left of B00 602, so no DC component from an adjacent block is subtracted from the DC component 604 of B00 prior to Golomb coding. Then the DC components prevColDCFreq and prevRowDCFreq are updated: the DC component 604 of B00 602 is stored in prevColDCFreq and, because B00 602 lies at the left edge of the image, the DC component 604 of B00 602 is also stored in prevRowDCFreq. Encoding then continues to the next block to the right along the top row of the image, i.e., (B01) 606. Because B01 606 does not lie at the left edge of the image, prevColDCFreq (that contains the DC component 604 of B00 602) is subtracted from the DC component 608 of B01 606 prior to Golomb coding and then the DC component 608 of B01 606 is stored in prevColDCFreq. Encoding continues in the same manner for blocks B02, B03, and B04 as for B01 606. Next, block B10 612 is encoded. Because B10 612 is at the left edge of the image, prevRowDCFreq (that contains the DC component 604 of B00 602) is subtracted from the DC component 614 of B10 612 prior to Golomb coding. Then the DC components prevColDCFreq and prevRowDCFreq are updated: the DC component 614 of B10 612 is stored in prevColDCFreq and, because B10 612 lies at the left edge of the image 600, the DC component 614 of B10 612 is also stored in prevRowDCFreq. Encoding continues sequentially to the right and encodes blocks B11, B12, B13, and B14 in the same manner as for B01. Lossy decoding follows the same pattern as lossy encoding.

Figure 7:
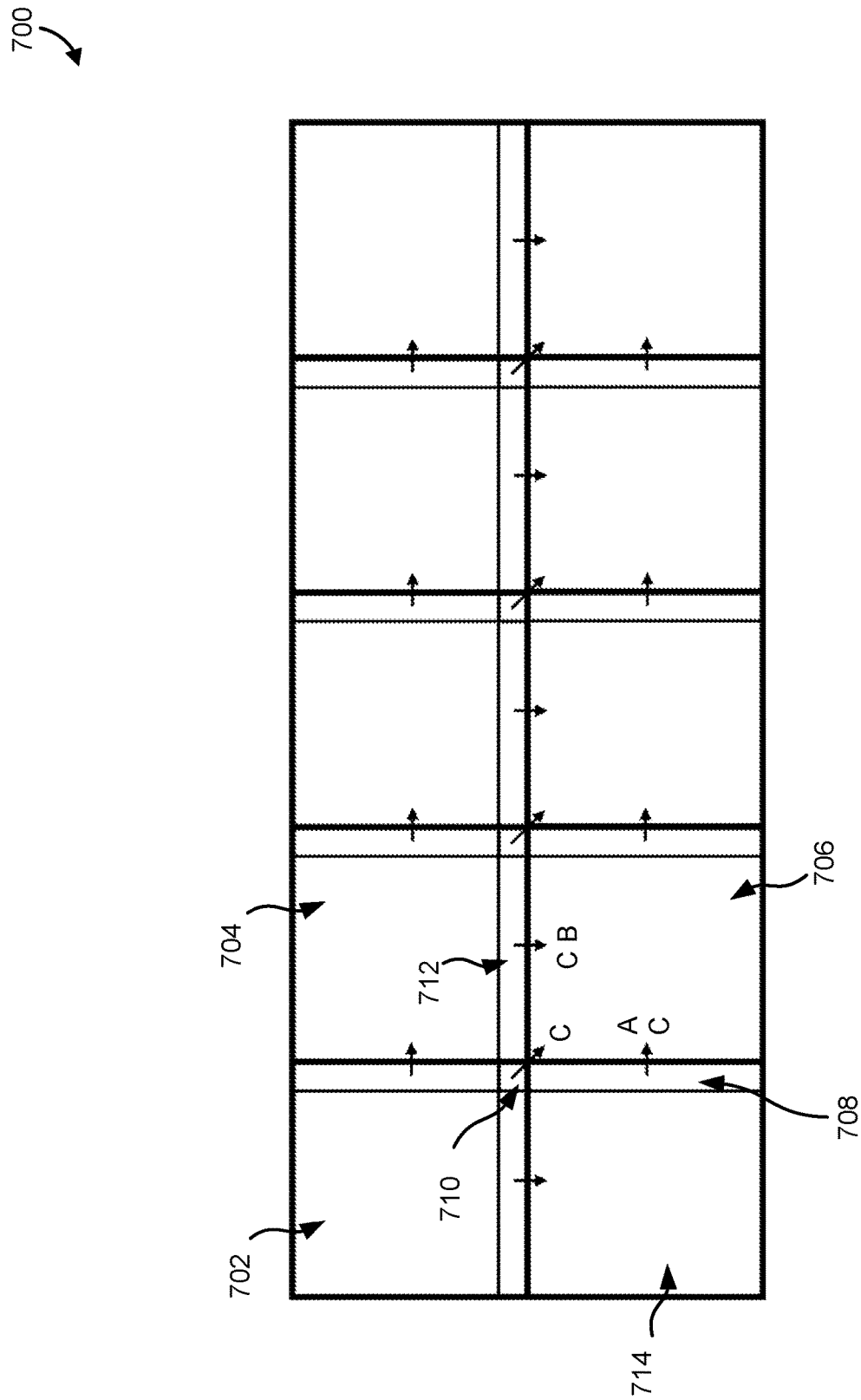
FIG. 7 illustrates another example diagram of a number of pixel blocks of image data, according to at least one embodiment.

FIG. 7 illustrates another example diagram 700 of a number of pixel blocks of image data. As described above in reference to FIG. 4, lossless JPEG compression of a pixel x uses pixels a, b, and c from adjacent pixel blocks. As illustrated in FIG. 7, the locations of pixels a, b, and c are indicated by narrow rectangles 708 and 712 and by small square 710 adjacent to the blocks that contain pixel x when x lies at the left edge or top edge of a block, such as block 706. Encoding pixel x at the left edge of a block obtains pixels a and c from the right edge 708 of the block to the left 714. Encoding pixel x at the top edge of a block 706 obtains pixels b and c from the bottom edge 712 of the block above 704. Encoding the top left pixel x of a block obtains pixel a from the top pixel of the right edge 708 of the block 714 to the left, pixel b from the left pixel of the bottom edge 712 of the block 704 above, and pixel c from the lower right corner 710 of the block 702 diagonally above and to the left. The pixels at the left edge of blocks 702, 714 that lie at the left edge of the image use a default value for pixels a and c. The pixels at the top edge of blocks 702, 704 that lie at the top of the image use a default value for pixels b and c. Lossless decoding of pixel x follows the same pattern as lossless encoding and requires pixels a, b, and c.

In some examples, hybrid compression and lossy block repair may utilize bookkeeping for pixels a, b, and c via three Boolean flags. These flags may be used when the block currently being decoded was encoded via lossless compression but adjacent blocks were encoded via lossy compression. In this scenario, the decoder has only lossy values for pixels a, b, and c from adjacent blocks and these pixel values lack the fidelity used for lossless decoding. One Boolean flag (prevColLossless) may specify whether pixels a and c at the right edge of the block currently being decoded are lossy. A second Boolean flag (prevDiagLossless) may specify whether pixel c at the lower right corner of the block diagonally above and to the left of the block currently being decoded is lossy. A third Boolean flag (prevRowLossless) may be an array of flags that specify, for each block in a row of blocks, whether pixels b and c at the bottom edge of the block are lossy. The prevRowLossless Boolean flag uses an array because the rows of blocks within an image are encoded sequentially from top to bottom and the blocks within each row are encoded sequentially from left to right. Hence, for each block in a row, a prevRowLossless array element is assigned by the block currently being decoded in one row and then used by the adjacent block that lies below in the next row. False Boolean flags cause lossless decoding to use a default pixel value instead of pixel values a, b, and c. Lossless encoding may use these Boolean flags in the same manner as lossless decoding. In an alternate embodiment, pixel color values, or other values of various different formats and lengths, instead of Boolean values may be stored in prevRowLossless, prevDiagLossless, and prevRowLossless. For example, instead of a false Boolean flag, a default pixel value may be stored, and instead of a true Boolean flag, a pixel value may be stored.

These Boolean flags are used as described above for the block currently being decoded and then they may be updated as follows. First, independent of whether the block currently being decoded was encoded via lossless or lossy compression, the prevRowLossless array element is copied into prevDiagLossless. This copy is performed because the prevRowLossless array element will be updated to specify whether pixels b and c at the bottom edge of the block currently being decoded are lossy; however, the adjacent block to the right of the block currently being decoded will use specification of whether pixel c at the lower right corner of the block diagonally above and to the left of the block currently being decoded is lossy. Hence, the prevRowLossless array element is copied into prevDiagLossless before prevRowLossless is updated in order to preserve information that will be overwritten by the update. After the prevRowLossless array element has been copied into prevDiagLossless, the prevColLossless flag and the prevRowLossless array element are updated. If the block currently being decoded was encoded via lossless compression, the update sets these two flags to true. If the block currently being decoded was encoded via lossy compression, the update sets these two flags to false. Lossless encoding may update the three Boolean flags in the same manner as lossless decoding. And as described above, in an alternate embodiment, pixel color values instead of Boolean values may be updated.

Figure 8:
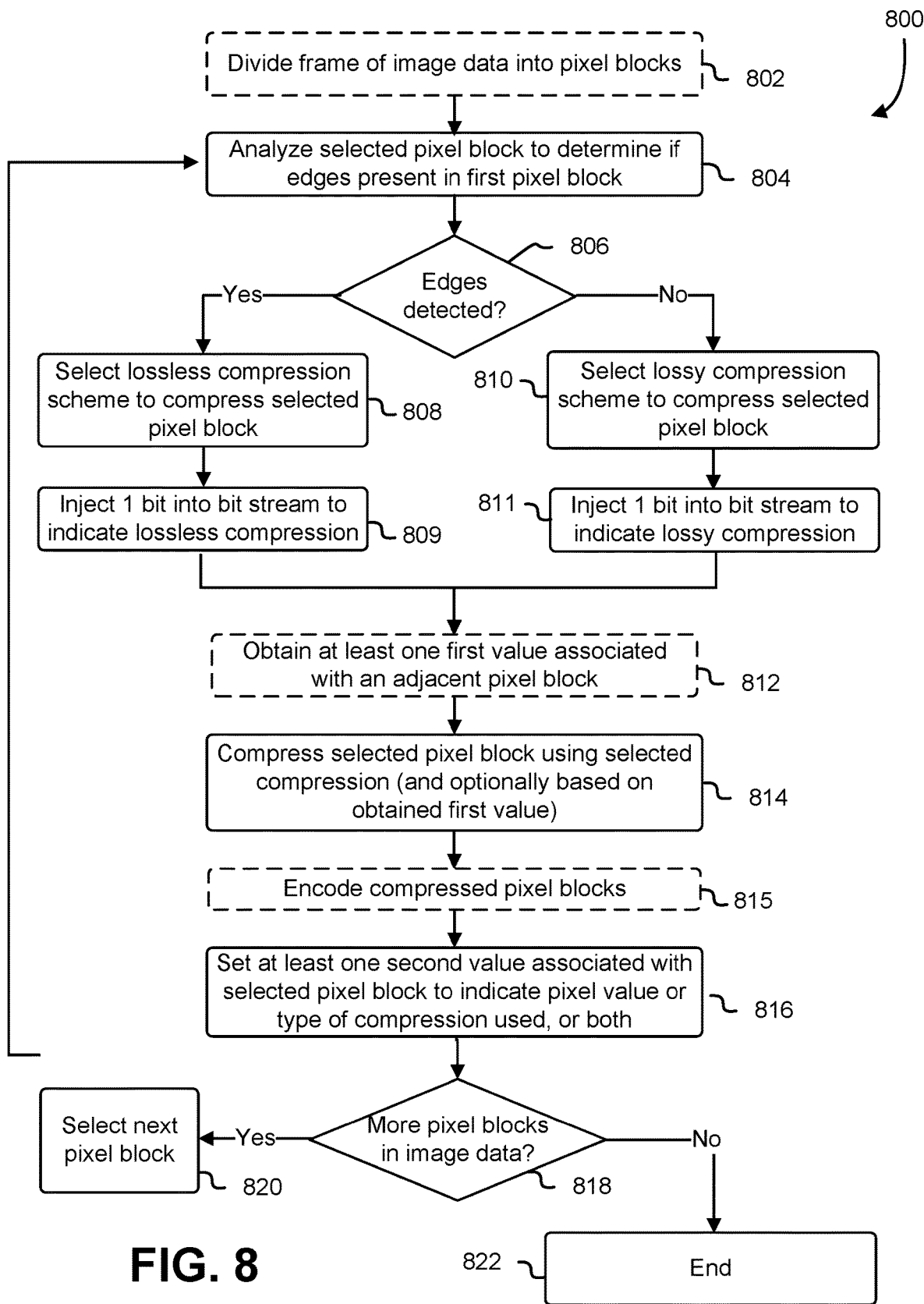
FIG. 8 illustrates an example process for hybrid compression or encoding of image data, according to at least one embodiment.

FIG. 8 illustrates an example process 800 for hybrid compression or encoding of image data. In some cases, process 800 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 800 may be performed by client device 104, and/or may be performed at least in part by image data compression 120 and/or hybrid compression component 122.

Process 800 may begin at operation 802, where a frame of image data may be divided into a number of pixel blocks. In some cases, the pixel blocks may be uniform is size, such as 8×8 pixels squares. In other cases, other sizes or shapes of pixel blocks may be selected. In yet some cases, the location, shape, and/or size of pixels blocks may be selected based on the image data itself, or other characteristics associated with the display of the image data. In some cases, operation 802 may be optional, such that areas of pixels are received and process 800 is performed on the already divided up pixel blocks.

Next, at operation 804, a selected pixel block may be analyzed to determine if any edges are present in the pixel block. Operation 804 may include using a Sobel operator, or various other techniques for detecting edges or other features in image data which may be more important or visible if image quality is degraded for those features. Examples of such features may include text, human faces, and other objects or features where detail, or the lack thereof, is more readily perceptible. In one example, operation 804 may include convolving the pixel block with a 3×3 edge filter such as the Sobel operator, to determine if one or more edges are present in the pixel block. In other cases, other techniques may be used to detect edges, such as convolving the pixel block with a 3×3 block or matrix with the value 8 at the center and the value −1 at all other positions. In yet other cases, various other techniques may be used.

If edges are detected, at operation 804, lossless compression may be selected to be performed on the selected pixel block, at operation 808. The lossless compression technique may be lossless JPEG as described above, or any other lossless or nearly lossless compression technique known in the art. In some examples, a 1-bit value or other indicator may be injected into the bit stream to indicate that lossless compression was used for the selected pixel block, at operation 809. In some cases, the indicator may precede the encoded image data from the pixel block, or may come after it. If edges are not detected, at operation 806, a lossy compression technique may be selected for the pixel block, at operation 810. The lossy compression technique selected may include DCT, as described above, or other lossy compression technique known in the art. In some examples, at operation 811, a 1-bit value or other indicator may be injected into the bit stream to indicate that lossy compression was used for the selected pixel block. In some cases, the indicator may precede the encoded image data for the pixel block, or may come after it.

Once a compression type is selected for the pixel block, at operations 808 or 810, process 800 may proceed to operation 812, in which at least one value associated with an adjacent pixel block in the image data may be obtained. The at least one value may indicate a type of compression used for the adjacent block, pixels values for the adjacent block, or a combination thereof. In some cases, the at least one value may include previous row and previous column values (such as DC values or other value or values representing an entire block of pixels) associated with lossy compression, and/or one or more values associated with lossless compression, such as three Boolean flags or pixel color values as described above in reference to FIG. 7. Operation 812 may be optional, and may be performed when differential encoding techniques are used. In some cases, the at least one value may include one or more values described below in reference to FIG. 9.

Next, at operation 814, the pixel block may be compressed according to the selected compression type (e.g., lossy or lossless), and in some cases, using the at least one value obtained from an adjacent pixel block. In some cases, such as where values from other blocks are obtained, differential encoding may be employed, as described above in reference to FIGS. 6 and 7. In the case where an adjacent block was compressed using a different type of compression than is selected for a current block, default values may be used instead of values stored for the adjacent blocks. For example, where an adjacent block is compressed using lossy compression, the value or values corresponding to lossless compression for that block may indicate that lossless compression was not used, and therefore may not include usable values for differential encoding for lossless compression of the current block. In such a case, the one or two of the Boolean flags associated with the adjacent block may be set to 0 (or in an alternate embodiment, default values may be supplied in lieu of Boolean flags). In either case, default values may then be used to perform the compression for the current block using a lossless compression technique.

In some cases, operation 815 may optionally be performed, in which the compressed pixel blocks may be further encoded, such as using standing encoding techniques or adaptable encoding, such as adaptable Golomb encoding, as described in greater detail; below.

At operation 816, at least one second value or indicator may be set and associated with the pixel block, to indicate the type of compression used on the block, one or more pixel values, or a combination thereof. This may include setting one or two of the lossy compression values (previous column and previous row) to the determined value, and setting one, two, or three Boolean flags associated with lossless compression to false, or alternately setting three pixel color values to default color values. In another example, where lossless compression is used, three of the Boolean values may be set to true, or alternately setting three pixel color values to actual (non-default) color values, and setting the two lossy compression values to 0 to indicate that lossless compression was used. It should be appreciated that other values and flags may be similarly used, and that the above values are only given by way of example. In some cases, the at least one second value may be maintained with or stored by the encoder/decoder, to enable more agile encoding and decoding of the image data using the appropriate type of compression and the correct values for differential encoding and decoding.

At operation 818, it may be determined if more pixel blocks are included in the image data. If yes, a next pixel block may be selected at operation 820, such as a pixel block to the right, or if no pixel blocks are to the right, the next pixel block selected may be the pixel block at the far left one row down from the current pixel block. Process 800 may then loop back to operation 804 and continue to compress pixel blocks, until it is determined, at operation 818, that there are no more pixel blocks in the image data, at which point, process 800 may end at 822.

Figure 9:
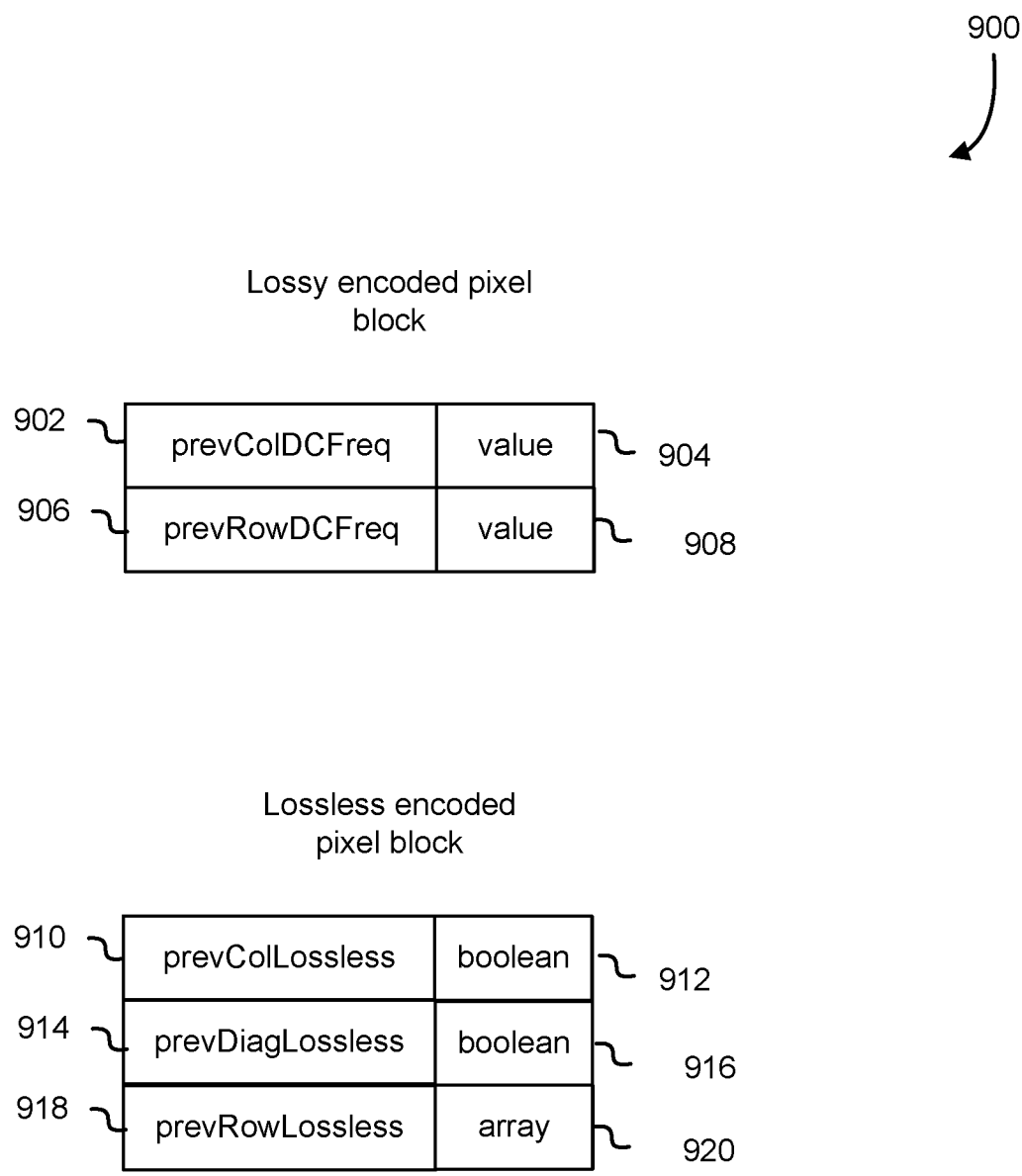
FIG. 9 illustrates an example data structure used for hybrid compression or encoding of image data, according to at least one embodiment.

FIG. 9 illustrates an example data structure 900 used for hybrid compression or encoding of image data. As illustrated, information associated with lossy compression may include a previous column DC value 902, 904 and a previous row DC value 906, 908. This data structure or collection of values may be maintained and updated sequentially for each pixel block in a compression and decompression process, as described in further detail above. It should be appreciated that other values and/or different number of values may similarly be used, such as different pixel values when some other form of lossy compression, other than DCT, is employed.

As also illustrated, information associated with lossless compression may include a Boolean value 912 for a previous column 910 to indicate whether or not the previous column was compressed using lossless compression, a Boolean value 916 for a previous diagonal block 914 to indicate whether or not the previous diagonal block was compressed using lossless compression, and an array 920 to store Boolean values associated with the previous row of blocks 918. These values and indications have been described above in detail above in reference to FIG. 7, and so will not be repeated again here. It should be appreciated that other values, data structures, number of values, type of values, etc. may be similarly used to keep track of the type of compression used for various blocks and relevant values used for differential and other types of encoding. And in particular, an alternate embodiment may store either default values or pixel color values instead of Boolean values.

As described above in reference to FIG. 7, both of these data structures may be set and maintained for each block in image data to enable hybrid compression/decompression, such that both lossy and lossless compression can be used for a single piece of image data. In some cases, the data structures described above can be stored and/or maintained or updated by the encoder and decoder as process 800 and process 1000, described below, are performed. In some cases, values 904, 908, and Boolean flags 912, 916, and/or 920 may take other forms, such as one or more pixel values in various forms, sentinel values used to indicate certain conditions (such as whether or not information is available to be used by adjacent blocks in encoding and decoding, as may generally be referred to an inner block coherence), and/or one or more default values. In some cases, values 904, 908, and Boolean flags 912, 916, and/or 920 may indicate the validity of those values to be sued for inner block coherence, such that a 0 or false may indicate that the information available is not valid for use with inner block coherence or differential encoding techniques described herein.

Figure 10:
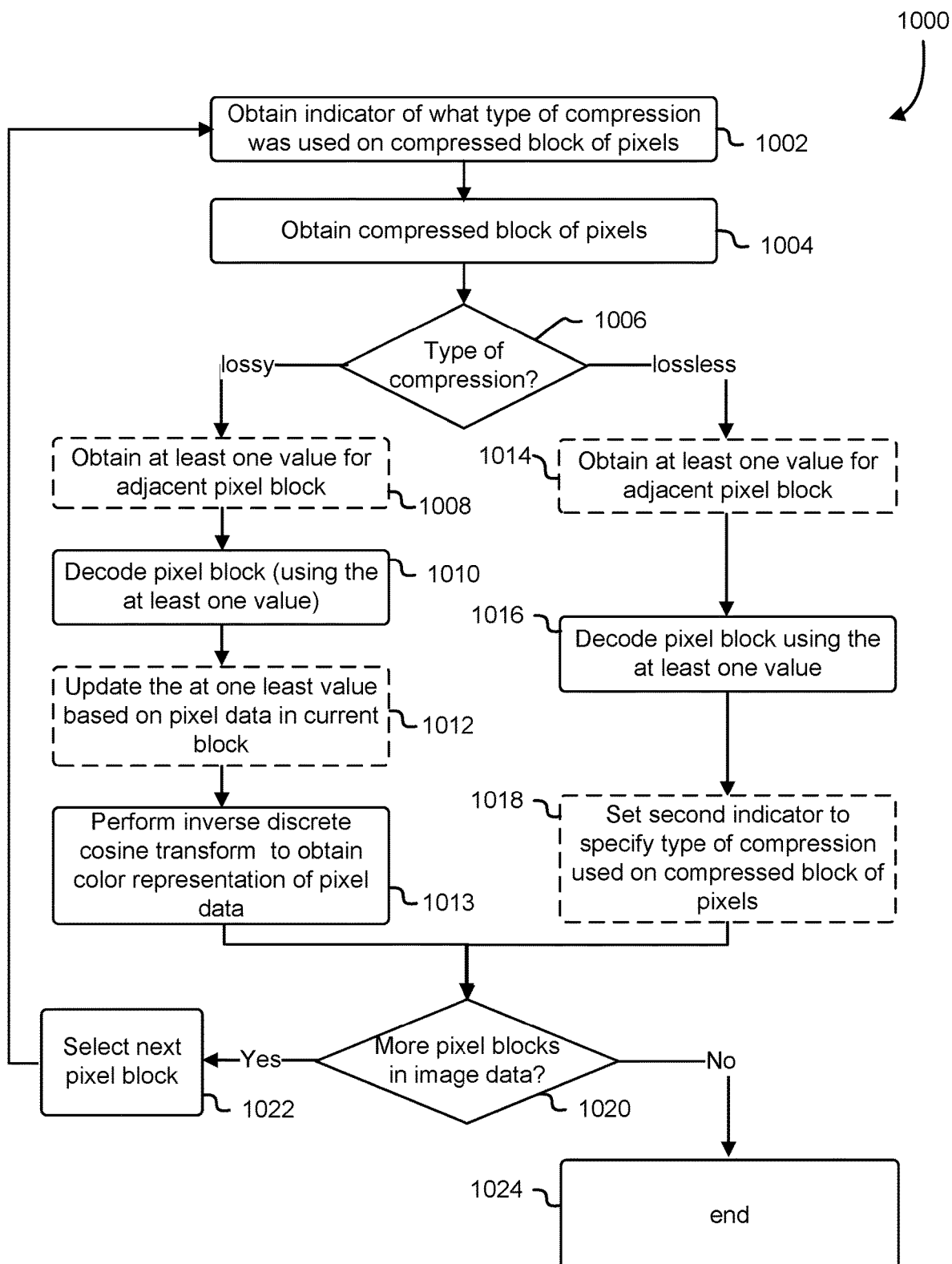
FIG. 10 illustrates an example process for hybrid decompression or decoding of image data, according to at least one embodiment.

FIG. 10 illustrates an example process 1000 for hybrid decompression or decoding of image data. In some cases, process 1000 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 1000 may be performed by client device 104, and/or may be performed at least in part by image data compression 120 and/or hybrid compression component 122.

Process 1000 may begin at operation 1002, an indicator of the type of compression that was used for the compressed block of pixels may be identified or obtained. Operation 1002 may include identifying a specific bit or bits in the bit stream, such that indicates whether the block was compressed using lossy or lossless compression. Next, at operation 1004, a compressed block of pixels may be obtained transformed from Golomb codes or other encoded values into integer values. In some cases, the compressed block of pixels may be in a bit stream, such as received at a client device 104 or a computing resource service provider 102 described above in reference to FIG. 1.

If the type of compression is determined to be lossy, at operation 1006 based on the obtained indicator or value, then, optionally, at least one value from an adjacent block may be obtained at operation 1008. This value may include one or more of the values described above in reference to FIG. 9, such as one or more of the previous row and previous column values. In some cases, as described above in reference to the compression process 800, default values may be used for differential decoding when the compression type of adjacent blocks is different. Next, at operation 1010, the pixel block may be decoded/decompressed using a lossy technique that includes differential decoding of the DC component of the spatial frequency amplitudes, followed by the performing an inverse DCT that transforms the spatial frequency amplitudes into pixel color values, at operation 1013. In some cases, when at least one value is obtained from an adjacent block, at operation 1008, such as when differential encoding/decoding is used, the at least one value may be used in one or more of operations 1010 and 1013. In the case where the at least one value is obtained, at operation 1008, process may optionally include operation 1012, in which the at least one value may be updated based on the pixel data in the current block of pixels, such that may be used by process 1000 to decode another adjacent block of pixels. In some aspects, the one or more values may include values described above in reference to data structure 900 of FIG. 9, such as one or more of values 904 and 908.

If the type of compression is determined to be lossless, at operation 1006 based on the obtained indicator or value, then, in some cases and optionally, at least one value from an adjacent block may be obtained at operation 1014. This value may include one or more of the values described above in reference to FIG. 9, such as one or more of the three Boolean flags (or alternately, pixel color values) associated with lossless compression. In some cases, as described above in reference to the compression process 800, default values may be used for differential decoding when the compression type of adjacent blocks is different. Next, at operation 1016, the pixel block may be decocted/decompressed using a lossless technique. In some cases, operation 1016 may include using the at least one obtained value from operation 1014 using to undo the differential encoding described above in reference to FIG. 4. In some cases, optionally, a second at least one indicator may be set to specify what type of compression was used on the compressed block of pixels, at operation 1018, such that may be used by process 1000 to decode another adjacent block of pixels. In some cases, operation 1018 may include updating the obtained at least value from operation 1014.

Upon performance of either of operations 1013 or 1018, process 1000 may proceed to operation 1020, whereby it may be determined if there are more pixel blocks in the image data. If yes, a new pixel block may be selected (e.g., following the left to right, top to bottom process described throughout this disclosure), at operation 1022, and process 1000 may loop through operations 1002 through 1020, until there are no more pixel blocks in the image data, as determined at operation 1020, at which point process 1000 may end at 1024.

Lossy Block Repair

Figure 11:
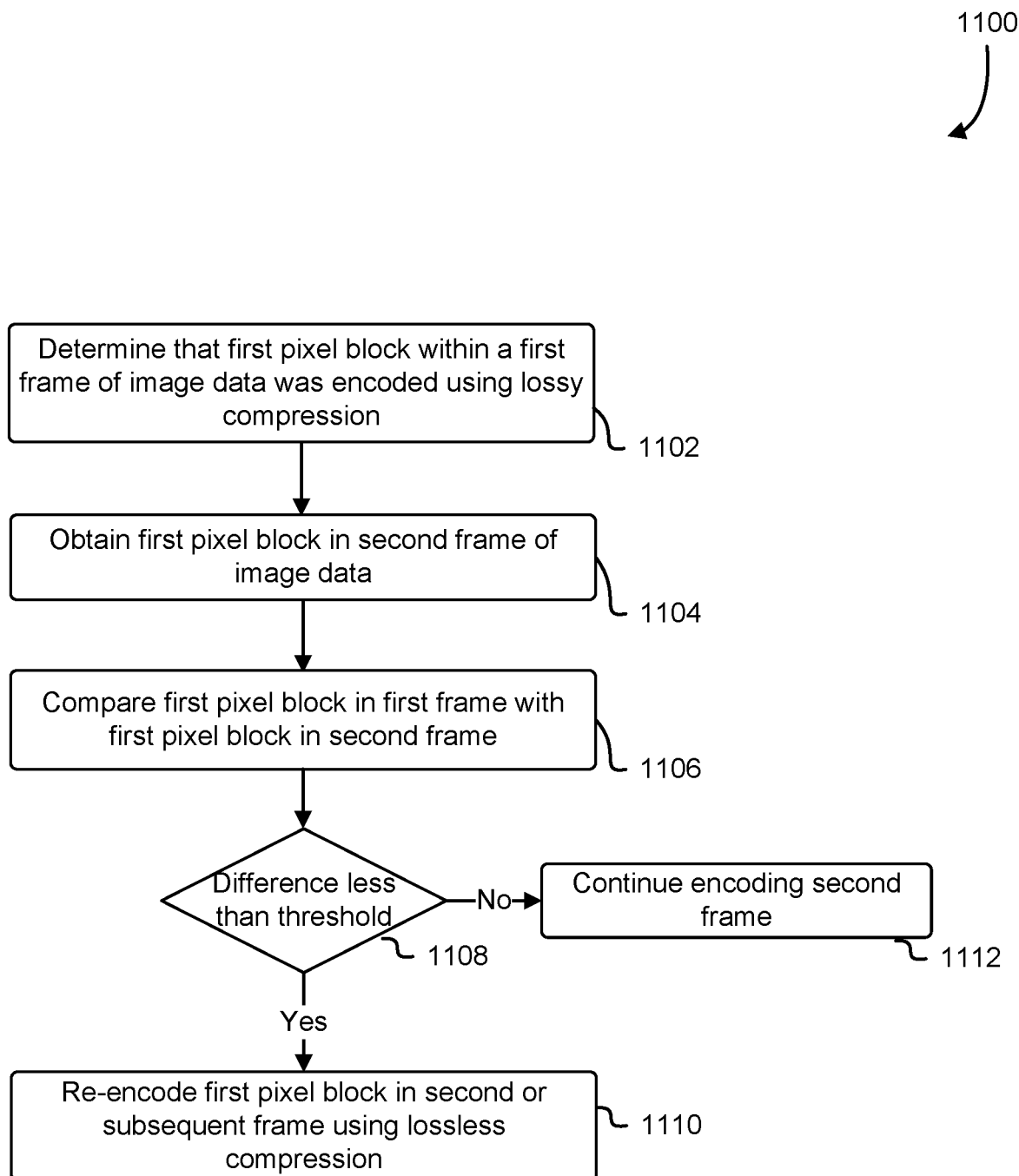
FIG. 11 illustrates an example process for repairing a lossy frame using lossless encoding, according to at least one embodiment.

FIG. 11 illustrates an example process 1100 for repairing a lossy frame using lossless encoding. In some cases, process 800 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 1100 may be performed by client device 104, and/or may be performed at least in part by image data compression 120 and/or lossy block repair component 124.

Process 1100 may begin at operation 1102, in which it may be determined that a first block of pixels in a first frame of image data was compressed or encoded using a lossy compression technique. In some cases, operation 1102 may include identifying a bit or other indicator associated with the pixel block in the encoded bit stream that specifies whether the block was compressed using lossy compression. In other cases, operation 1102 may include determining based on a size of the image data corresponding to the block of pixels, or other attribute of the block (such as may be known in the art), that the block was compressed using lossy compression techniques. In some cases, such as where a hybrid codec is used, bits in the bit stream of the compressed image data and/or one or more indicators, such as one or more indicators described above in reference to FIG. 9, may be used to determine that a given block was compressed using lossy compression.

Next, at operation 1104, the corresponding pixel block in a second frame of the image data may be obtained. At operation 1106, the selected pixel block in a first frame may be compared to the same pixel block occurring in second frame of the image data. If the two blocks do not differ significantly, as in the case where the sum of the absolute values of the differences between the corresponding pixels of the pixel block in the two frames is determined to be less than a threshold, at operation 1108, then the pixel block in the second or a subsequent frame may be re-encoding using lossless compression, at operation 1110. In this way, by only re-encoding blocks that haven't changed for at least one frame via lossless encoding, the quality of the image may be increased without the overhead of re-encoding the entire image data using lossless compression.

If the difference between the pixels of the pixel block in the two frames is determined to be greater than or equal to the threshold, at operation 1108, then the second frame may be encoding using lossy compression, at operation 1112. In some cases, process 1100 may be applied to some or all blocks of pixels in the image data.

Figure 12:
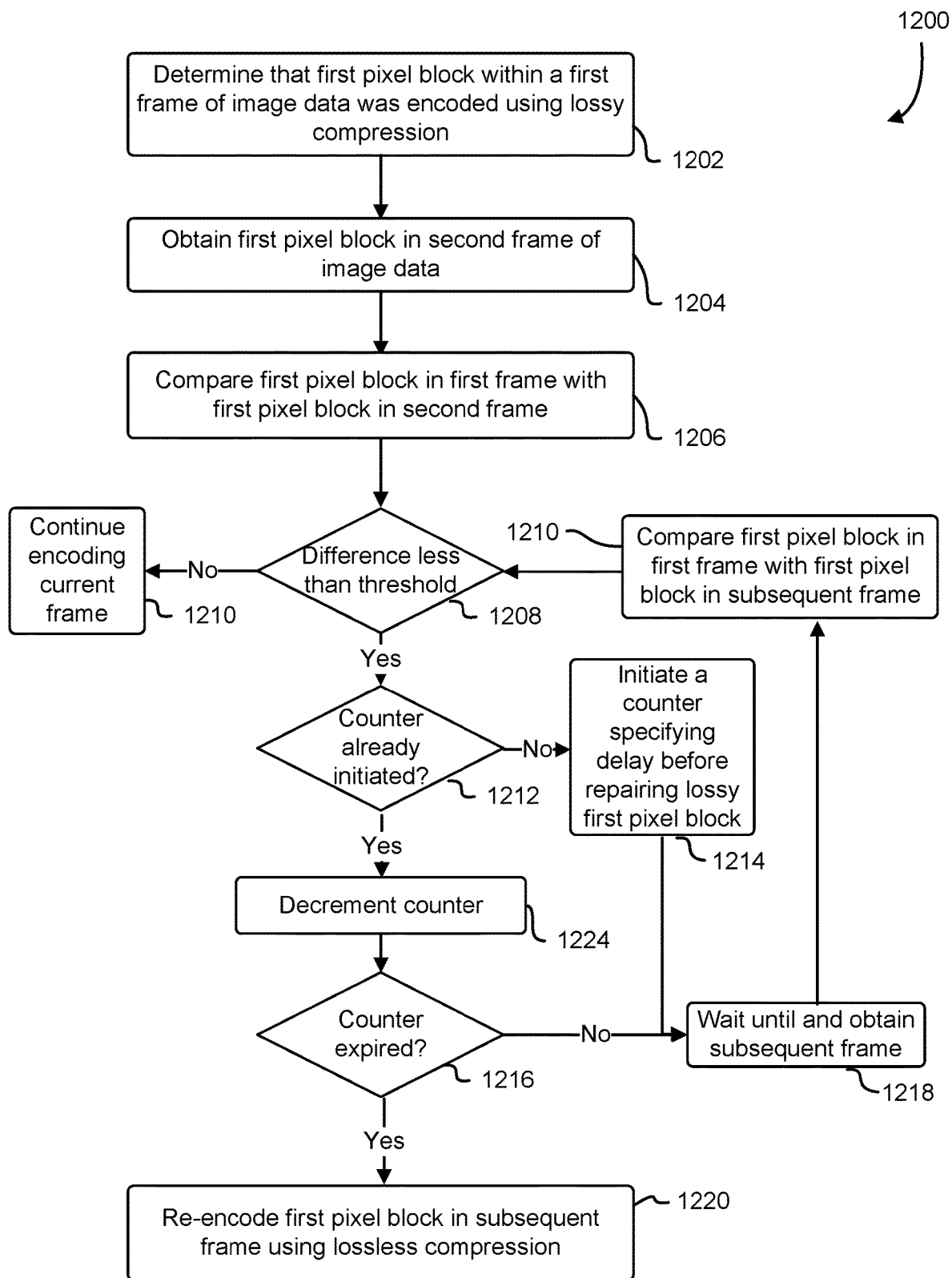
FIG. 12 illustrates another example process for repairing a lossy frame using lossless encoding, according to at least one embodiment.

FIG. 12 illustrates another example process 1200 for repairing a lossy frame using lossless encoding. In some cases, process 1200 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 1200 may be performed by client device 104, and/or may be performed at least in part by image data compression 120 and/or lossy block repair component 124. Some operations of process 1200 incorporate aspects of similar operations described above in reference to process 1100 of FIG. 11; for the sake of brevity, those operations will not be described again here.

Process 1200 may begin at operation 1202, in which it may be determined that a first block of pixels in image data was compressed or encoded using a lossy compression technique. Next, at operation 1104, the corresponding pixel block in a second frame of the image data may be obtained. At operation 1204, the selected pixel block in a first frame may be compared to the same pixel block occurring in second frame of the image data.

If the two blocks do not differ significantly, as in the case where the sum of the absolute values of the differences between the corresponding pixels of the pixel block in the two frames is determined to be less than a threshold, at operation 1208, then process 1200 may proceed to operation 1212, where it may be determined if a counter has already been initiated, with the counter indicating a number of frames to wait until re-encoding the lossy pixel block using lossless compression. In some cases, the counter may indicate a length of the delay, such as in frames, time, or other metric. In some cases, the counter may be maintained by the encoder. In one specific example, the image counter may be specified in a Boolean flag of a value corresponding to lossless compression, such as one or more of values 912 or 916 described above in reference to FIG. 9. In other cases the counter may be specified or maintained elsewhere, such as in the encoded data. If a counter has not already been initiated or set, then a new counter may be initiated at operation 1214 to specify a delay (such as in a number of frames) to wait until re-encoding the pixel block using loss less compression. If a counter has already been initiated for the block, as determined at operation 1212, then the counter may be decremented, at operation 1224, and then process 1216 may determine if the counter has expired, at operation 1216.

In either case that the counter has not expired, as determined at operation 1216, or a counter has just been initiated, at operation 1214, process 1200 may proceed to operation 1218, where a subsequent frame may be obtained. The first pixel block in the subsequent frame may then be compared to the first pixel block in the first frame (or in some embodiments, the second frame), at operation 1210. If the two blocks do not differ significantly, as in the case where the sum of the absolute values of the differences between the corresponding pixels of the pixel block in the two frames is determined to be less than a threshold, as determined at operation 1208, then process 1200 may loop through operations 1208, 1212, 1224, and 1216, until the counter is determined to be expired, at operation 1216. At that point, the pixel block may be re-encoded using lossless compression. If, at operation 1208, the pixel block has changed significantly, as in the case where the sum of the absolute values of the differences between the corresponding pixels of the pixel block in the two frames is determined to be greater than a threshold, then the counter may be discarded and the pixel block of the current frame may be encoded using lossy compression. In some cases, process 1200 may be applied to some or all blocks of pixels in image data. In some cases, where process 1200 is used in conjunction with hybrid compression, as described throughout this document, one or more indications may be set, as also described above, to indicate what type of compression was used on individual pixel blocks to enable decoding and decompressing the image data accordingly. In some aspects, after process 1100 or 1200 has been performed on a block of pixels, the pixel block may only be re-encoded if the pixels within the block change above a threshold amount, which may be the same or different threshold amount used to determine whether to invoke lossy block repair in the first instance.

Adaptable Golomb Codes

In some cases, the exponential-Golomb codes presented below are suitable for lossless JPEG wherein the probabilities of successive prediction residuals decrease, i.e., the probability of 0 is greater than the probability of ±1 that is greater than the probability of ±2 or ±3, etc.:

0→1
+1→010
−1→011
+2→00100
−2→00101
+3→00110
−3→00111
+4→0001000
−5→0001011
+6→0001100
−7→0001111
+8→000010000

However, in lossy JPEG the probability of spatial frequency amplitude 0 may not be greater than the probability of ±1, ±2 or ±3, etc. because the zig-zag algorithm does not encode 0 directly but instead run-length encodes 0 either as a count of preceding zero amplitudes or as the end-of-block (EOB) code. Consider, for example, an image where the probability of ±1 is greater than the probability of ±2 or ±3 that is greater than the probability of 0 that is greater than the probability of ±4 through ±7. In this case, the Golomb codes presented above are not optimum. The Golomb codes presented below achieve optimum compression relative to the Golomb codes presented above because fewer bits are used to represent the more probable values of ±1 and ±2 or ±3 at the expense of more bits required to represent the less probable value of 0:

0→001
+1→10
−1→11
+2→0100
−2→0101
+3→0110
−3→0111
+4→0001000
−5→0001011
+6→0001100
−7→0001111
+8→000010000

It is generally not possible to use the above, optimum Golomb codes because the Golomb codes are compiled with the source code. However, it is possible to reinterpret the Golomb codes that represent integers in the range [−2047, 2047] for 8-bit color using a 12-element lookup table. For the case above, the first four entries of the lookup table are (1, 2, 0, 3) and are interpreted as follows. No prefix zeros may now map to one binary bit and the most probable values, ±1. One prefix zero may now map to two binary bits and the next most probable values, ±2 and ±3. Two prefix zeros may now map to no binary bits and the next most probable value, 0. Three prefix zeros may map to three binary bits and the next most probable values, ±4 through ±7.

The effect of the exemplary 12-element lookup table is to remap the exponential-Golomb codes so that they are interpreted as the above optimized or enhanced Golomb codes that achieve better compression. For 8-bit color, the default 12-element lookup table may contain (0, 1, 2, 3, . . . 0.9, 10, 11) and is suitable for lossless encoding wherein the prediction residuals follow the distribution shown in the $Y_i$ graph 306 of FIG. 3. For lossy encoding wherein the spatial frequency amplitudes may not be distributed as shown in the $Y_i$ graph 306 of FIG. 3, a lookup table such as (1, 2, 0, 3, . . . 9, 10, 11), which may be estimated from the aggressiveness of lossy quantization, often attains optimum compression. If not, the lookup table may be redefined via two-pass encoding. The first pass does not encode the image but instead constructs a histogram of the spatial frequency amplitudes. The histogram is then analyzed to construct an optimum lookup table that is used during the second pass to encode the image. However, experience with lossy encoding reveals that two-pass encoding rarely achieves significantly better compression than a lookup table such as (1, 2, 0, 3, . . . 9, 10, 11). For 16-bit color, a 20-element lookup table may be used instead of a 12-element lookup table.

Figure 13:
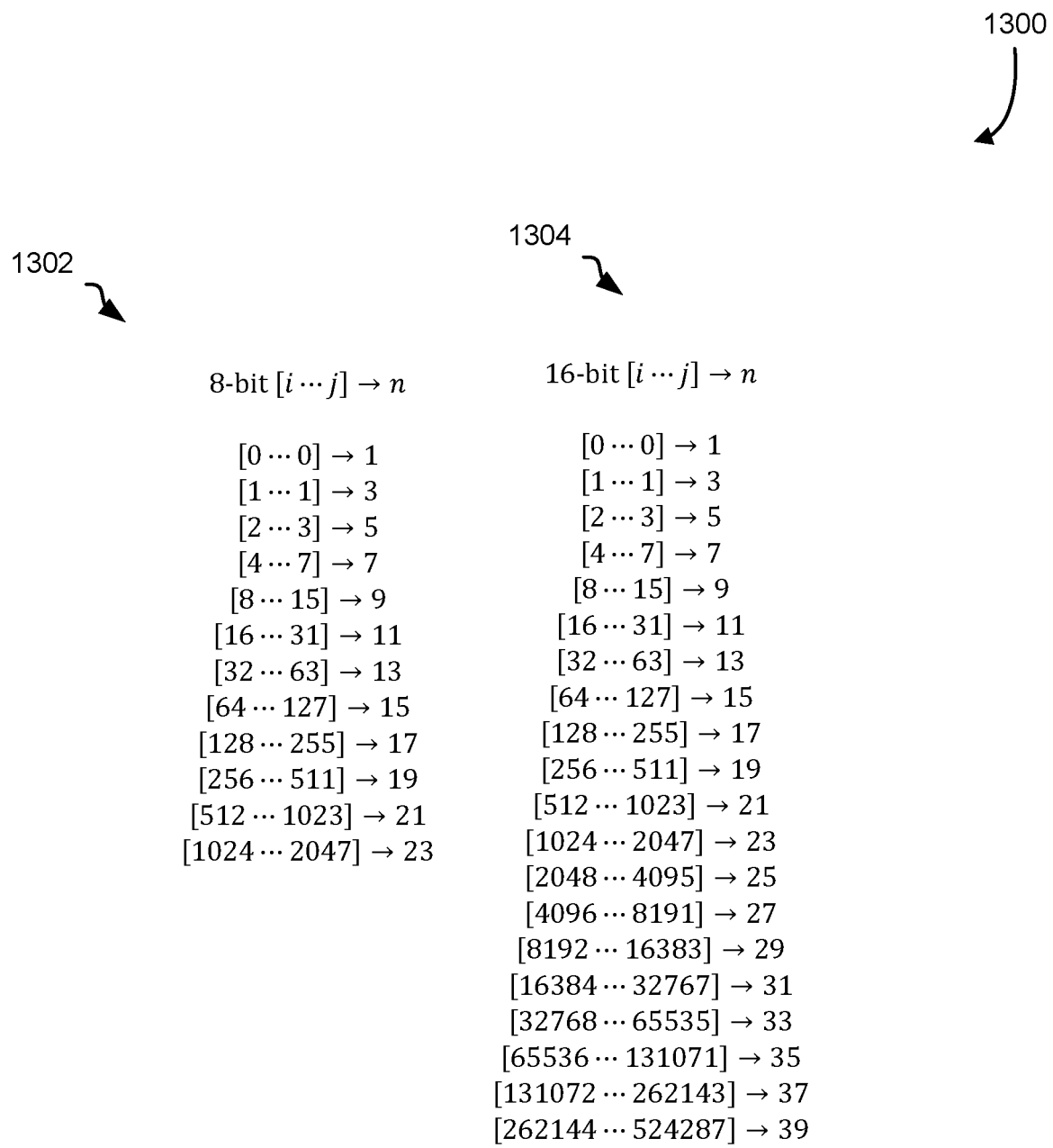
FIG. 13 illustrates an example lookup tables used for Golomb encoding, according to at least one embodiment.

FIG. 13 illustrates an example 1300 of lookup tables 1302 and 1304 used for Golomb encoding. Encoding signed integers is facilitated via lookup tables 1302 and 1304 that map from an integer to an exponential Golomb code for 8-bit and 16-bit color.

These lookup tables do not map from an integer i to an entropy code but rather from a range of integers [i . . . j] to a Golomb code length n. The magnitude i of the signed integer is used to address the lookup table to obtain the code length n for that integer. A Golomb code for that integer is then constructed trivially by multiplying the magnitude of the integer by 2, adding 1 for a negative integer or adding 0 for a positive integer, and then placing the result right-justified in a bit field of length n, as can be seen from inspection of the exponential Golomb codes. The Golomb code for an unsigned integer has code length n−1 because it omits the sign bit.

This approach uses a lookup table or other data structure of only 2,048 bytes for 8-bit color but requires a significantly larger lookup table of 524,288 bytes for 16-bit color. However, because for Golomb codes the magnitude is preceded by only leading zeros, the following transformation permits the use of the 8-bit lookup table for 16-bit color:

if i>=2048 then n=length[i/256]+16 else n=length[i]

where length[i] is the lookup table entry that returns the code length n for the magnitude i.

Figure 18:
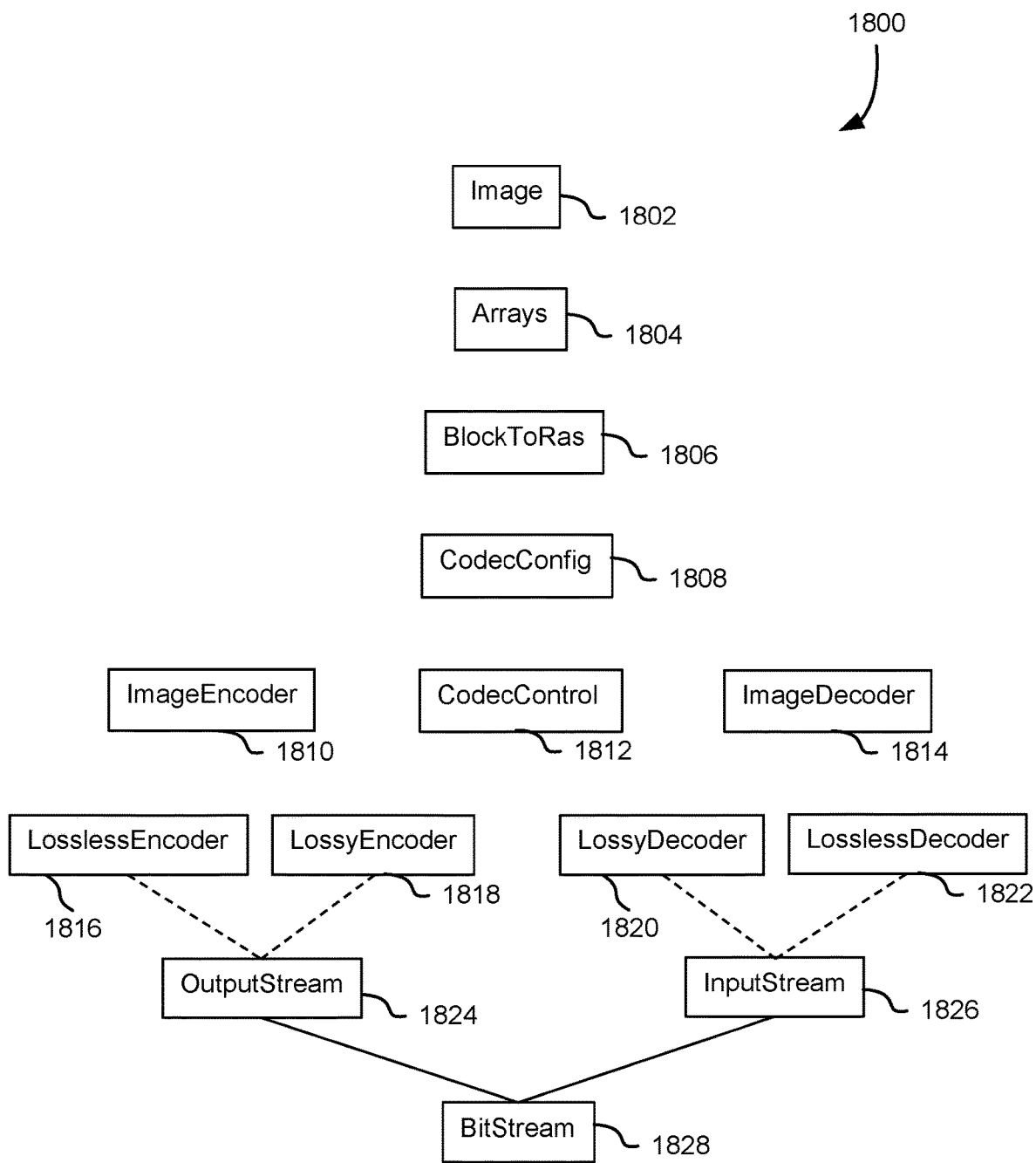
FIG. 18 illustrates an example of a codec architecture used to implement the described techniques.

FIG. 18 illustrates an example 1400 of lookup tables 1402 and 1404 which may also be used for Golomb decoding.

The lookup tables 1402 and 1404 map from a range of bits [b . . . c] to a number of leading zeros z. The number of leading zeros is obtained for 8-bit color by retrieving the leading 11 bits b from the bit stream and using those bits to address the lookup table to obtain the number of leading zeros z. For 16-bit color, the leading 19 bits b are retrieved from the bit stream and used to address the lookup table to obtain the number of leading zeros z. Then for either 8-bit or 16-bit color, those z bits are skipped within the bit stream and the next z bits that are read from the bit stream represent the magnitude of a Golomb-coded signed integer. The next bit read from the bit stream represents the sign of the integer.

This approach uses a lookup table or data structure of only 2,048 bytes for 8-bit color but requires a significantly larger lookup table of 524,288 bytes for 16-bit color. However, because for Golomb codes the magnitude is preceded by only leading zeros, the following transformation permits the use of the 8-bit lookup table for 16-bit color:

if b>=2048 then z=zeros[b/256] else z=zeros[b]+8 where zeros[b] is the lookup table entry that returns the number of leading zeros z for the bits b.

Unsigned integers may use the above Golomb lookup tables by simply not reading an LSB sign bit from the bit stream.

Figure 15:
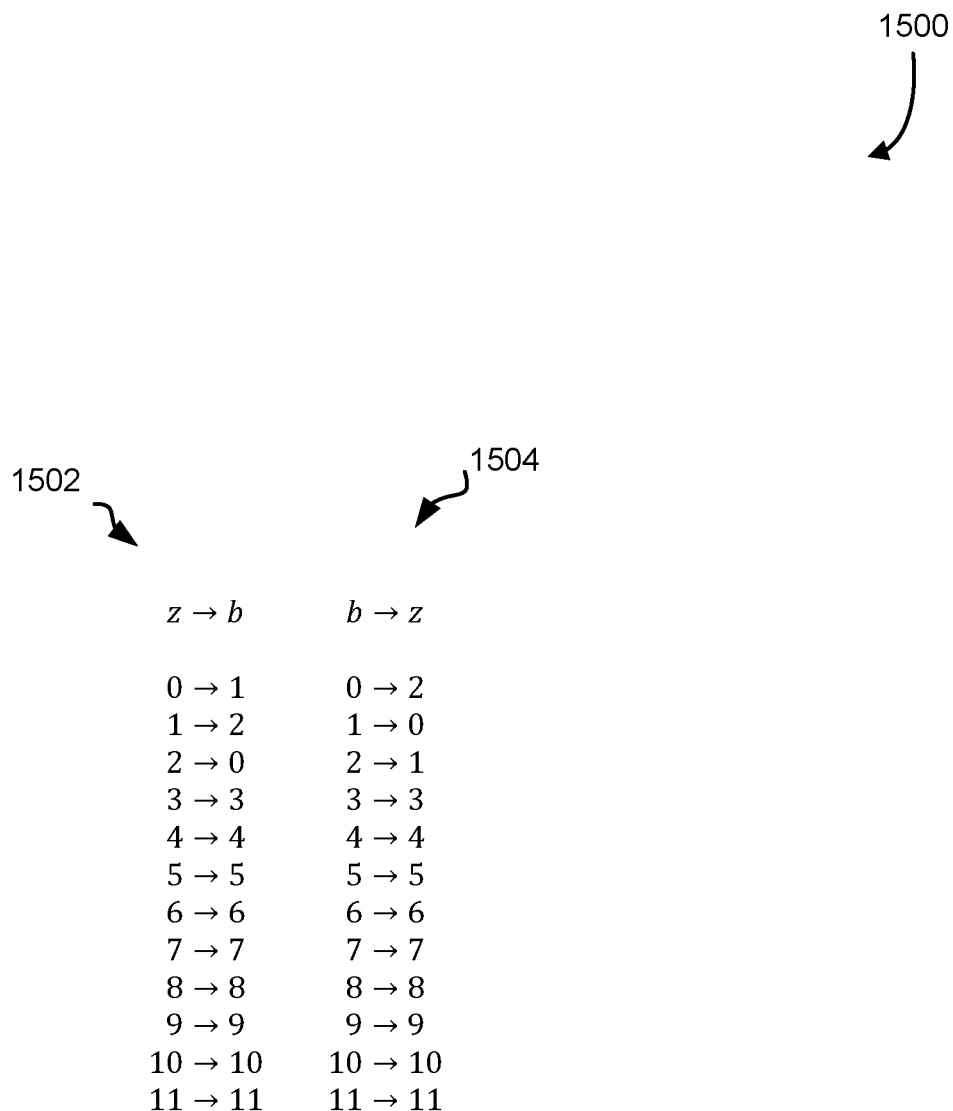
FIG. 15 illustrates an example of adaptive lookup tables used for Golomb encoding and decoding, according to at least one embodiment.

FIG. 15 illustrates an example 1500 of adaptive lookup tables 1502 and 1504, which may be used for Golomb encoding and decoding. Adaptable Golomb codes can be used such that the Golomb lookup tables are re-interpreted via a second set of lookup tables, such as lookup tables 1502 and 1504.

Table or data structure 1502 maps from a number of leading zeros z to a number of binary bits b. Table or data structure 1504 is the inverse of the table 1502 and maps from a number of binary bits b to a number of leading zeros z.

Table 1502 may be used for decoding. First, a decoding lookup table, such as table 1402 or 1404, provides a number of leading zeros z. Next, z is used as an index to the table 1502 in order to obtain the number of binary bits b that the adaptable Golomb code contains. For an unsigned Golomb code, b binary bits are then read from the bit stream. For a signed Golomb code, b+1 binary bits are read from the bit stream to include an LSB sign bit.

Table 1504 may be used for encoding. First, an encoding lookup table, such as table 1302 or 1304 provides a signed Golomb code length n=z+b+1 where z is the number of leading zeros, b is the number of binary bits, and one additional bit is included to represent an LSB sign bit. Because the encoding lookup tables are constructed for non-adaptable Golomb codes for which z=b, it is possible to obtain z and b from n via z=b=n/2. For an adaptable Golomb code, b is the correct number of binary bits but z is not the correct number of leading zeros. Hence, b is used as an index to the table 1504 to obtain the correct number of leading zeros z'. Then the length of the unsigned adaptable Golomb code is n'=b+z' and the length of the signed adaptable Golomb code is n'=b+z'+1 including an LSB sign bit.

Figure 16:
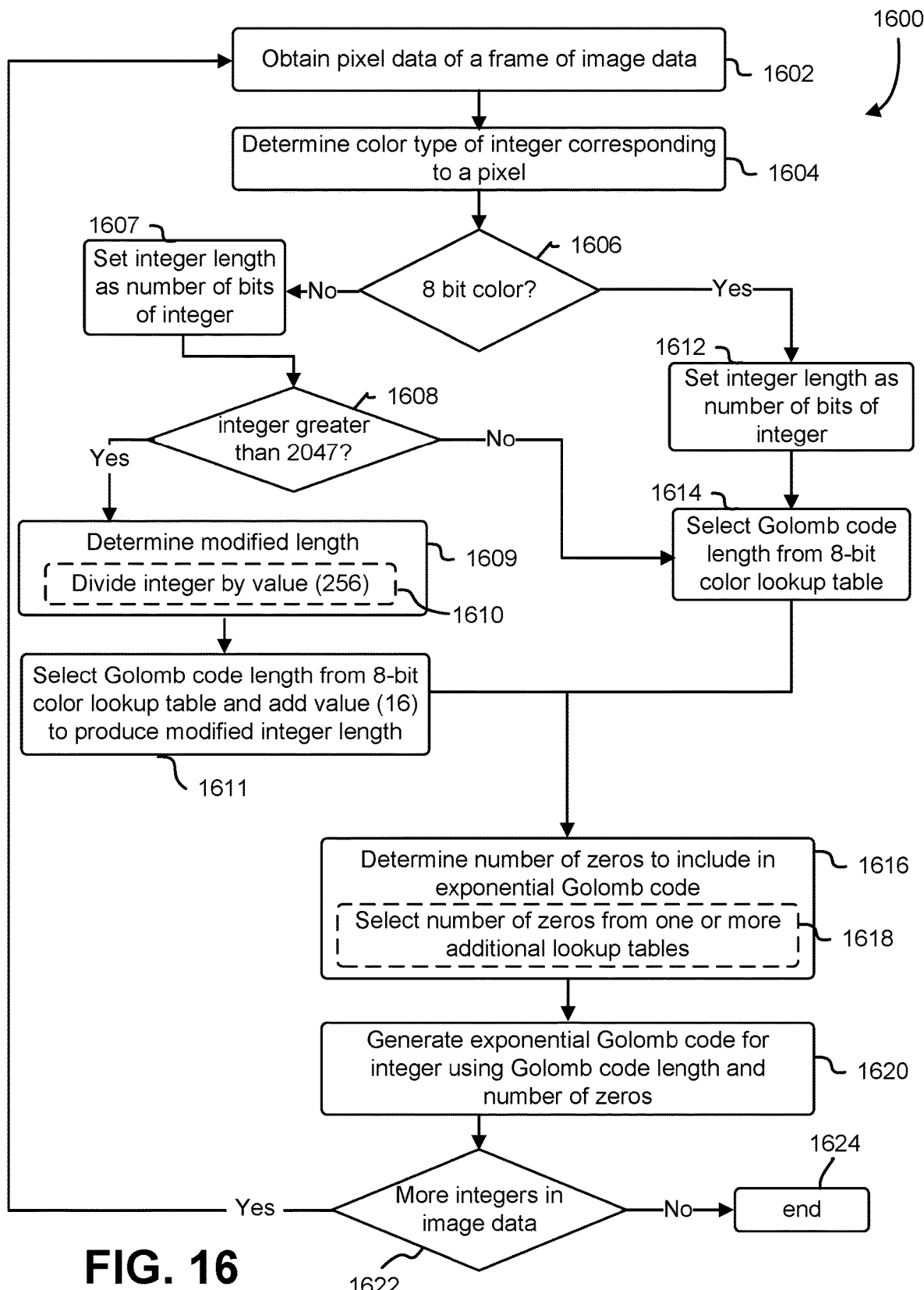
FIG. 16 illustrates an example process for adaptive encoding image data, according to at least one embodiment.

FIG. 16 illustrates an example process 1600 for adaptable exponential Golomb encoding image data. In some cases, process 1600 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 1200 may be performed by client device 104, and/or may be performed at least in part by image data compression 120 and/or enhanced encoding component 126.

Process 1600 may begin at operation 1602, in which pixel data of a frame of image data may be obtained. Next, at operation 1604, a color type of an integer corresponding to a pixel of the image data may be determined. In one example, the determining may include determining, at operation 1606, if the color value corresponds to an 8-bit color value (or alternatively a different color value or type). If yes, an integer length may be set as a number of bits of the integer, at operation 1612. Next, at operation 1614, a code length may be selected from an 8-bit color lookup table. In some examples, the code length may be a Golomb code length, as used in Golomb or exponential Golomb encoding.

If the integer does not correspond to an 8-bit color value, such as including a 16-bit color value, the integer length may initially be set as the number of bits of the obtained integer. Next, it may be determined if the integer is greater than a value, at operation 1608. In the case of 8 bit color and a different bit color value, such as 16 bit color, the value used in operation 1608 may be 2047. If other types of color are used, it will be appreciated that the value used at operation 1608 may be different. If the integer is not greater than 2047, then process may proceed to operation 1614, where the integer length that is used for the color lookup table may be the number of bits of the integer. However, if the integer is greater than 2047, then process 1700 may proceed to operation 1609, in which a modified length may be determined. In some cases, operation 1608 may include performing one or more mathematical operations on the number of bits of the integer, such as dividing the integer by a first value, e.g., 256. Next, operation 1611 may be performed, in which a code length may be selected from an 8-bit color lookup table using the determined modified length, and a second value added to the code length to produce a modified integer length. In some examples, the code length may be a Golomb code length, as used in Golomb or exponential Golomb encoding. In the 8-bit/16 bit example, the second value added to the Golomb code length may equal 16. It should be appreciated that the 8-bit and 16-bit color types are only given by way of example. Other color types and lengths may be similarly used, with the first and second values changing to accommodate the different representations of different color types. In some examples operation 1612 may also be modified to accommodate different color types. In any of the implementations, in some cases, the different integer lengths determined by operations 1612 and 1614, or conversely by operations 1608, 1610, and 1611 may be mapped to single lookup table or other data structure. In yet some examples, instead of using a lookup table, some other type of mapping may be performed between an integer length or modified inter length and a Golomb code length, such as using a hash tree, a tree map and other similar processes that may be sued to map or translate one length to another code length.

Upon performance of operation 1611 or operation 1614, process 1600 may continue to operation 1616, in which a number of zeros to include in the code may be determined. In some cases, where a signed bit is included with the integer, the signed bit may also be taken into account when determining the number of zeros. In some cases, operation 1616 may include selecting a number of zeros from one or more adaptive or additional lookup tables, at operation 1618, such as adaptive tables described above in reference to FIG. 15. In some aspects, the adaptive lookup table may correlate most frequently used or estimated most frequently used values to a fewest number of zeros. In some cases, an adaptive lookup table may be selected and configured for different types of compression used for image data, such as one for lossy compression and one for lossless compression. In other cases, different tables may be configured for signed and unsigned integer values. In yet some examples multiple tables may be used for any of a number of different attributes of the color values, such as combining signed and unsigned and lossy and lossless compression types, and/or based on other attributes. In one example, one or more adaptive lookup tables may be used for signed values of Golomb codes. In this way, different tables may optimize the most frequent values occurring in the different types of compressed image data outputs with the smallest codes, to increase the compression of the image data.

Next, at operation 1620, a code may be generated for the integer using the code length and the number of zeros. In some cases, the code may be a Golomb or exponential Golomb code, using techniques known in the art to generate such codes. In some cases, generating the Golomb code may include multiplying a magnitude of the integer by two to produce a modified integer and adding a signed bit to the end of the modified integer to produce a signed modified integer. In this example, a number of zeros may then be appended to the modified signed integer to produce the exponential Golomb code for the integer, wherein the number of zeros is determined based on the Golomb code length.

If there are more integers in the data, as determined at operation 1622, then process 1600 may loop back to operation 1602 and continue to operation 1622, until there is no more image data, at which point process 1600 may end at 1624. It should be appreciated that other color values may be similarly used and tested for in process 1600 to similar effect. In these examples, different lookup tables or other data structures may be utilized to map integer values to code length to generate a code for the integer. It should be appreciated, that in some cases, some other value, such as 1, and/or a designated sentinel value may be used in place of zeros described above in process 1600 to a similar effect. In addition, the zeros, or in other cases, sentinel values, may be prepended or appended to the bits in the process of encoding. In yet other case, process 1600 may be applied to a different type of encoding, such as Huffman or other types of encoding.

Figure 17:
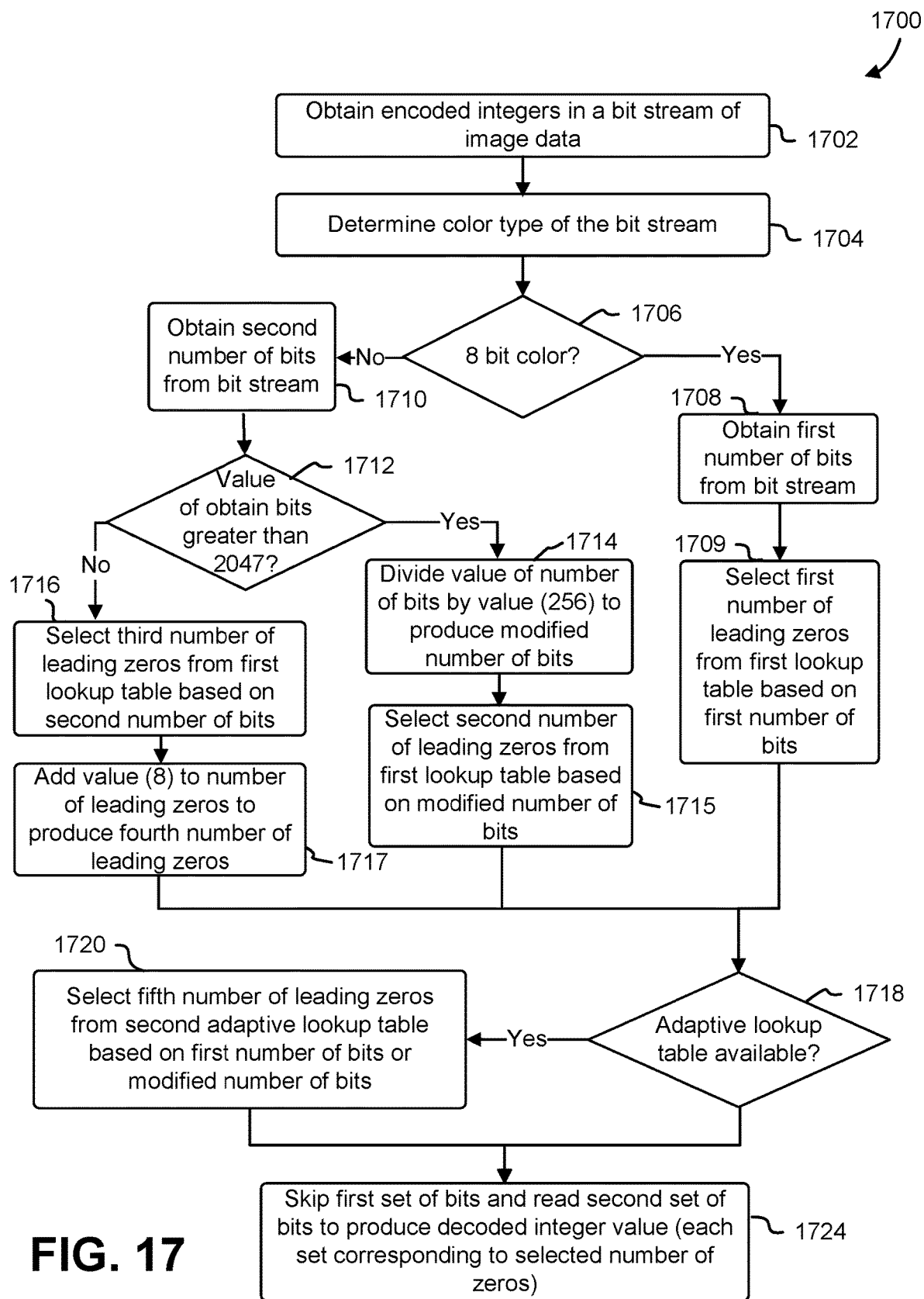
FIG. 17 illustrates an example process for adaptive decoding image data, according to at least one embodiment.

FIG. 17 illustrates an example process 1700 for adaptive exponential Golomb decoding image data. In some cases, process 1700 may be performed by one or more of the services, such as the virtual computer system service 108, data storage service 110, streaming service 112, media analytics service 118, and/or conferencing service 114 provided by a computing resource service provider 102 described above in reference to FIG. 1. In some cases, process 1700 may be performed by client device 104, and/or may be performed at least in part by image data compression 120 and/or enhanced encoding component 126.

Process 1700 may begin at operation 1702, in which encoded integers or values may be obtained in or from a bit stream of image data. A color type of the bit stream, or alternatively, a color type of specific values of the bit stream, may then be determined at operation 1704. In some cases, operation 1704 may include techniques known in the art for detecting/determining what type of color value is in a bit stream. If the integer corresponds to an 8-bit color value, as determined at operation 1706, then a first number of bits may be obtained from the bit stream, at operation 1708. Next, at operation 1709, a first number of leading zeros may be selected, such as from a first lookup table, based on the first number of bits.

Process 1700 may then proceed to operation 1718, where it may be determined if an adaptive or secondary lookup table is available. If yes, a second number of leading zeros for the decoding may be selected from the adaptive lookup table, at operation 1720, based on the number of bits. In some cases, the second number of leading zeros may be selected based on the first number of leading zeros determined at operation 1709. In either case, using the determined number of leading zeros, a first set of bits in the bit stream may be skipped, and a second set of bits may be read to produce a decoded integer value, at operation 1724. In some cases, each set of bits, the first set and the second set, may be of a length equal to the number of leading zeros determined at operations 1709 or 1720.

If the color type does not correspond to 8-bit color values, such as instead to 16-bit color values, as determined at operation 1706, then a second number of bits may be obtained from the bit stream, at operation 1710. Process 1700 may then proceed to operation 1712, where it may be determined if the value of the bits is greater than a specified number, such as in the 8-bit/16 bit distinction, 2047. If yes, the value of the number of bits may be divided by a first value, such as 256, to produce a modified number of bits, at operation 1714. Process 1700 may then proceed to at operation 1715, where a second number of leading zeros may be selected, such as from a first lookup table, based on the modified number of bits.

If, however, the value of the obtained bits is less than the specified value (e.g., 2047), then a third number of leading zeros may be selected from a first lookup table based on the second number of bits, at operation 1716. In some cases, the third number of leading zeros may correspond to the first number of leading zeros and/or may be selected based on the first number of bits determined at operation 1708. Next, at operation 1717, a value, such as 8, may be added to the third number of leading zeros to produce a fourth number of leading zeros.

In either case, process 1700 may then proceed to operation 1718 1718, where it may be determined if an adaptive or secondary lookup table is available. If yes, a fifth number of leading zeros for the decoding may be selected from the adaptive lookup table, at operation 1720, based on the first number, second number of bits, or modified number of bits determined at operations 1708, 1710, or 1714. In some cases, the fifth number of leading zeros may be selected based on the first, second, or fourth number of leading zeros determined at operation 1709, 1715, or 1717. In either case, using the determined number of leading zeros, a first set of bits in the bit stream may be skipped, and a second set of bits may be read to produce a decoded integer value, at operation 1724. In some cases, each set of bits, the first set and the second set, may be of a length equal to the number of leading zeros determined at operations 1709, 1715, 1717, or 1720.

It should be appreciated that other color values may be similarly used and tested for in process 1700 to similar effect. In these examples different lookup tables or other data structures may be utilized to map integer values to code length to generate a code for the integer and different values may be used to determine the first number of bits and/or the modified number of bits As similarly described above in reference to process 1600 of FIG. 16, process 1700 may be applied to different color types, by modifying the different values used through process 1700, including used at operations 1712, 1714, and/or 1717. It should be appreciated, that in some cases, some other value, such as 1, and/or a designated sentinel value may be used in place of zeros described above in process 1700 to a similar effect. In addition, the zeros, or in other cases, sentinel values, may be prepended or appended to the bits in the process of decoding.

FIG. 18 illustrates an example of a codec architecture 1800 used to implement the described techniques. In some cases, codec 1800 may include one or more aspects of the fast JPEG codec described above. In some cases, codec may be is implemented in any of a variety of coding languages, including in C++, and may be organized as the classes depicted FIG. 18. As illustrated in FIG. 18, solid lines may indicate class inheritance and dashed lines may indicate sharing of a class instance.

In some examples, image data compression process or codec 120, including one or more of hybrid compression 122, lossy block repair 124, and/or adaptive encoding 126, may implement or incorporate one or more aspects of the codec architecture 1800. In some cases, one or more of services 108, 110, 112, 114, and/or 118, and/or client device 104 may utilize and implement aspects of codec 1800 to enable one or more of hybrid compression, lossy block repair, and/or enhanced or adaptive encoding as described herein. It should be appreciated that codec 1800 is only given by way of example, and that various modifications to the codec are contemplated herein.

The Image class 1802 defines an image and may include static methods for color space transformation, logarithmic transformation, and chrominance down-sampling and up-sampling, as described above. Each instance of an image may provide an image width and height and three vectors to store the color components. The Arrays class 1804 may include static arrays for lossy JPEG such as the Y and $C_b$ or $C_r$ quantization matrices, a lookup table that specifies each step along the zig-zag path, and a lookup table that specifies adaptation of the Golomb codes according to the aggressiveness of lossy quantization. The Block To Ras class 1806 may include static methods that copy pixels from color component vectors of the Image class 1802 to a pixel block, such as an 8×8 block (or a 4×4 block for chrominance sub-sampling) and vice versa.

Each instance of the Codec Config class 1808 may store configuration parameters that select compression options for the lossless and lossy compression algorithms, as described in greater detail above. Each instance of the Codec Control class 1812 may store characteristics of an image, such as its height and width, as well data that describe inter-block coherence between adjacent blocks of an image, such as the DC component of the spatial frequency amplitudes from adjacent blocks for lossy compression or Boolean values that specify valid pixel color values for lossless compression, as described above in reference to FIG. 9.

The Lossless Encoder class 1816 may include static methods that compute the forward prediction equations presented in FIG. 4. Each instance may provide methods to (1) encode an 8×8 block (or other sized block of pixels) via a forward prediction equation, (2) test whether the color value of each pixel in the block exactly equals the color value of the pixel from the same position in the previous block, and (3) test whether all pixel color values in the block exactly equal one another.

The Lossless Decoder class 1822 may include static methods that compute the inverses of the forward prediction equations presented in FIG. 4. Each instance may provide methods to decode a pixel block via an inverse prediction equation or to reconstruct a pixel block in the case where (1) the color value of each pixel in block exactly equals the color value of the pixel from the same position in the previous block or (2) all pixel color values in the 8×8 block exactly equal one another.

The Lossy Encoder class 1818 may include static lookup tables for quantization and normalization, as well as static methods that compute the forward DCT. Each instance may provide methods that (1) encode a pixel block via the zig-zag algorithm, such as described above in reference to FIG. 5, (2) test whether the color value of each or a majority of pixels in the block approximately equals the color value of the pixel from the same position in the previous block, and (3) test whether all or a configurable number of pixel color values in the block approximately equal one another.

The Lossy Decoder class 1820 may include static lookup tables for dequantization and denormalization, as well as static methods that compute the inverse DCT. Each instance may provide methods to decode a block via the zig-zag algorithm or to reconstruct a block in the case where (1) the color value of each pixel or a majority of pixels in block approximately equals the color value of the pixel from the same position in the previous block or (2) all or a configurable number of pixel color values in the block approximately equal one another.

The Image Encoder class 1810 may include static methods that encode an image by encoding three color components, optionally using a separate thread for each component that is optionally encoded as multiple horizontal strips using a separate thread for each strip. Image Encoder class 1810 may also include a static method that merges multiple bit streams that were produced by separate threads into a single array. The Image Decoder class 1814 may include static methods that decode an image by decoding three color components, optionally using a separate thread for each component that is optionally decoded as multiple horizontal strips using a separate thread for each strip.

The Bit Stream class 1828 may define a bit stream and is the base class for all of the classes that are connected with a solid line in FIG. 18. Each instance of Bit Stream 1828 provides a buffer for bit stream output or input, various flags necessary for bit stream control, and an instance of Codec Config 1808. The Output Stream class 1824 may include a static lookup table used for Golomb encoding. Each instance provides methods that write to a bit stream. Output Stream class 1824 may inherit the Bit Stream class 1828. The Input Stream class 1826 may include a static lookup table used for Golomb decoding. Each instance may provide methods that read from a bit stream. Input Stream class 1826 may inherit the Bit Stream class 1828.

Figure 19:
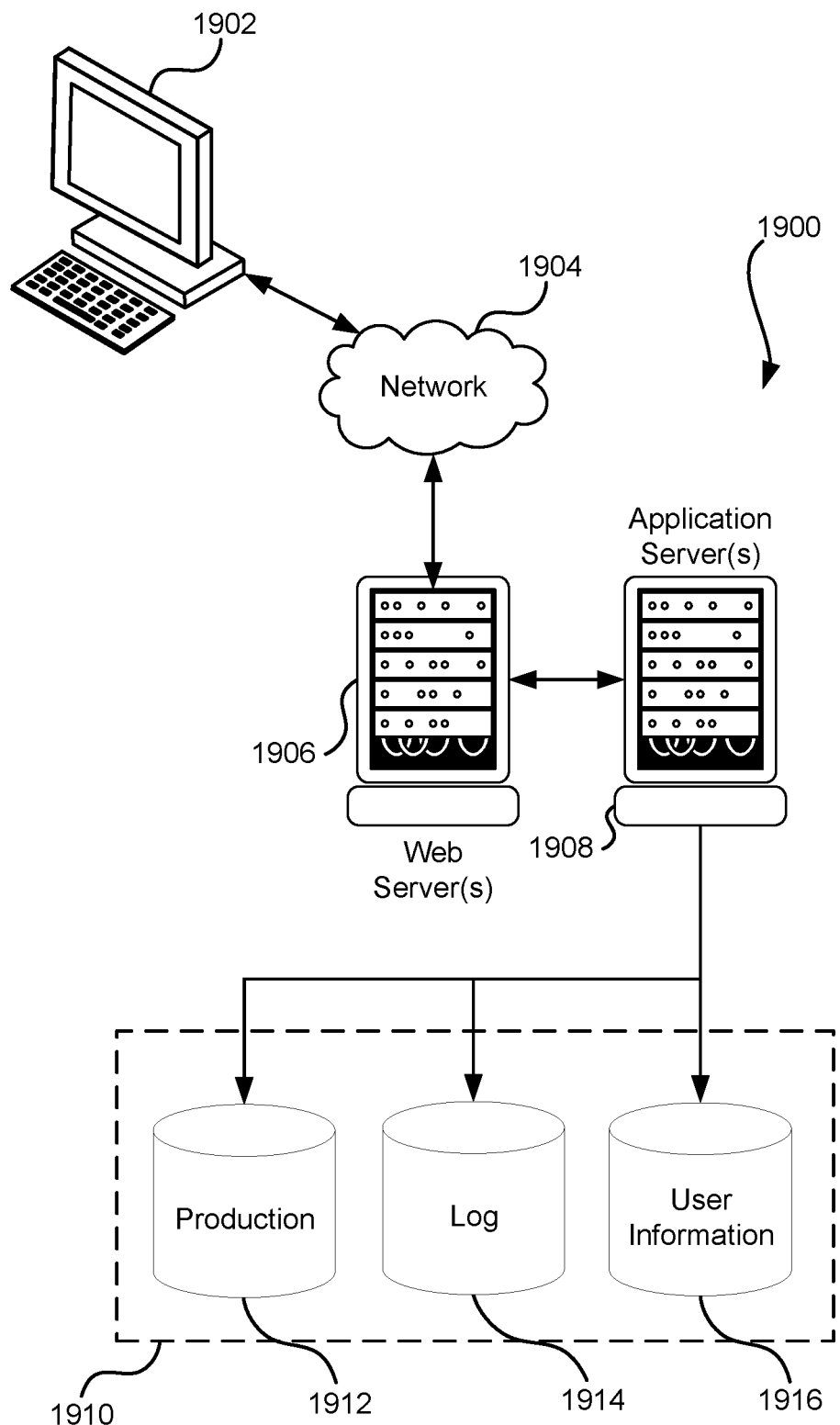
FIG. 19 illustrates a system in which various embodiments can be implemented.

FIG. 19 illustrates aspects of an example system 1900 for implementing aspects in accordance with an embodiment. As will be appreciated, although a web-based system is used for purposes of explanation, different systems may be used, as appropriate, to implement various embodiments. In an embodiment, the system includes an electronic client device 1902, which includes any appropriate device operable to send and/or receive requests, messages, or information over an appropriate network 1904 and convey information back to a user of the device. Examples of such client devices include personal computers, cellular or other mobile phones, handheld messaging devices, laptop computers, tablet computers, set-top boxes, personal data assistants, embedded computer systems, electronic book readers, and the like. In an embodiment, the network includes any appropriate network, including an intranet, the Internet, a cellular network, a local area network, a satellite network or any other such network and/or combination thereof, and components used for such a system depend at least in part upon the type of network and/or system selected. Many protocols and components for communicating via such a network are well known and will not be discussed herein in detail. In an embodiment, communication over the network is enabled by wired and/or wireless connections and combinations thereof. In an embodiment, the network includes the Internet and/or other publicly addressable communications network, as the system includes a web server 1906 for receiving requests and serving content in response thereto, although for other networks an alternative device serving a similar purpose could be used as would be apparent to one of ordinary skill in the art.

In an embodiment, the illustrative system includes at least one application server 1908 and a data store 1910, and it should be understood that there can be several application servers, layers or other elements, processes or components, which may be chained or otherwise configured, which can interact to perform tasks such as obtaining data from an appropriate data store. Servers, in an embodiment, are implemented as hardware devices, virtual computer systems, programming modules being executed on a computer system, and/or other devices configured with hardware and/or software to receive and respond to communications (e.g., web service application programming interface (API) requests) over a network. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered system. Data stores, in an embodiment, communicate with block-level and/or object-level interfaces. The application server can include any appropriate hardware, software and firmware for integrating with the data store as needed to execute aspects of one or more applications for the client device, handling some or all of the data access and business logic for an application.

In an embodiment, the application server provides access control services in cooperation with the data store and generates content including but not limited to text, graphics, audio, video and/or other content that is provided to a user associated with the client device by the web server in the form of HyperText Markup Language ("HTML"), Extensible Markup Language ("XML"), JavaScript, Cascading Style Sheets ("CSS"), JavaScript Object Notation (JSON), and/or another appropriate client-side or other structured language. Content transferred to a client device, in an embodiment, is processed by the client device to provide the content in one or more forms including but not limited to forms that are perceptible to the user audibly, visually and/or through other senses. The handling of all requests and responses, as well as the delivery of content between the client device 1902 and the application server 1908, in an embodiment, is handled by the web server using PHP: Hypertext Preprocessor ("PHP"), Python, Ruby, Perl, Java, HTML, XML, JSON, and/or another appropriate server-side structured language in this example. In an embodiment, operations described herein as being performed by a single device are performed collectively by multiple devices that form a distributed and/or virtual system.

The data store 1910, in an embodiment, includes several separate data tables, databases, data documents, dynamic data storage schemes and/or other data storage mechanisms and media for storing data relating to a particular aspect of the present disclosure. In an embodiment, the data store illustrated includes mechanisms for storing production data 1912 and user information 1916, which are used to serve content for the production side. The data store also is shown to include a mechanism for storing log data 1914, which is used, in an embodiment, for reporting, computing resource management, analysis or other such purposes. In an embodiment, other aspects such as page image information and access rights information (e.g., access control policies or other encodings of permissions) are stored in the data store in any of the above listed mechanisms as appropriate or in additional mechanisms in the data store 1910.

The data store 1910, in an embodiment, is operable, through logic associated therewith, to receive instructions from the application server 1908 and obtain, update or otherwise process data in response thereto, and the application server 1908 provides static, dynamic, or a combination of static and dynamic data in response to the received instructions. In an embodiment, dynamic data, such as data used in web logs (blogs), shopping applications, news services, and other such applications, are generated by server-side structured languages as described herein or are provided by a content management system ("CMS") operating on or under the control of the application server. In an embodiment, a user, through a device operated by the user, submits a search request for a certain type of item. In this example, the data store accesses the user information to verify the identity of the user, accesses the catalog detail information to obtain information about items of that type, and returns the information to the user, such as in a results listing on a web page that the user views via a browser on the user device 1902. Continuing with this example, information for a particular item of interest is viewed in a dedicated page or window of the browser. It should be noted, however, that embodiments of the present disclosure are not necessarily limited to the context of web pages, but are more generally applicable to processing requests in general, where the requests are not necessarily requests for content. Example requests include requests to manage and/or interact with computing resources hosted by the system 1900 and/or another system, such as for launching, terminating, deleting, modifying, reading, and/or otherwise accessing such computing resources.

In an embodiment, each server typically includes an operating system that provides executable program instructions for the general administration and operation of that server and includes a computer-readable storage medium (e.g., a hard disk, random access memory, read only memory, etc.) storing instructions that, if executed by a processor of the server, cause or otherwise allow the server to perform its intended functions (e.g., the functions are performed as a result of one or more processors of the server executing instructions stored on a computer-readable storage medium).

The system 1900, in an embodiment, is a distributed and/or virtual computing system utilizing several computer systems and components that are interconnected via communication links (e.g., transmission control protocol (TCP) connections and/or transport layer security (TLS) or other cryptographically protected communication sessions), using one or more computer networks or direct connections. However, it will be appreciated by those of ordinary skill in the art that such a system could operate in a system having fewer or a greater number of components than are illustrated in FIG. 19. Thus, the depiction of the system 1900 in FIG. 19 should be taken as being illustrative in nature and not limiting to the scope of the disclosure.

The various embodiments further can be implemented in a wide variety of operating environments, which in some cases can include one or more user computers, computing devices or processing devices that can be used to operate any of a number of applications. In an embodiment, user or client devices include any of a number of computers, such as desktop, laptop or tablet computers running a standard operating system, as well as cellular (mobile), wireless and handheld devices running mobile software and capable of supporting a number of networking and messaging protocols, and such a system also includes a number of workstations running any of a variety of commercially available operating systems and other known applications for purposes such as development and database management. In an embodiment, these devices also include other electronic devices, such as dummy terminals, thin-clients, gaming systems and other devices capable of communicating via a network, and virtual devices such as virtual machines, hypervisors, software containers utilizing operating-system level virtualization and other virtual devices or non-virtual devices supporting virtualization capable of communicating via a network.

In an embodiment, a system utilizes at least one network that would be familiar to those skilled in the art for supporting communications using any of a variety of commercially available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and other protocols. The network, in an embodiment, is a local area network, a wide-area network, a virtual private network, the Internet, an intranet, an extranet, a public switched telephone network, an infrared network, a wireless network, a satellite network, and any combination thereof. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In an embodiment, the system utilizes a web server that runs one or more of a variety of server or mid-tier applications, including Hypertext Transfer Protocol ("HTTP") servers, FTP servers, Common Gateway Interface ("CGI") servers, data servers, Java servers, Apache servers, and business application servers. In an embodiment, the one or more servers are also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python or TCL, as well as combinations thereof. In an embodiment, the one or more servers also include database servers, including without limitation those commercially available from Oracle °, Microsoft °, Sybase °, and IBM® as well as open-source servers such as MySQL, Postgres, SQLite, MongoDB, and any other server capable of storing, retrieving, and accessing structured or unstructured data. In an embodiment, a database server includes table-based servers, document-based servers, unstructured servers, relational servers, non-relational servers, or combinations of these and/or other database servers.

In an embodiment, the system includes a variety of data stores and other memory and storage media as discussed above that can reside in a variety of locations, such as on a storage medium local to (and/or resident in) one or more of the computers or remote from any or all of the computers across the network. In an embodiment, the information resides in a storage-area network ("SAN") familiar to those skilled in the art and, similarly, any necessary files for performing the functions attributed to the computers, servers or other network devices are stored locally and/or remotely, as appropriate. In an embodiment where a system includes computerized devices, each such device can include hardware elements that are electrically coupled via a bus, the elements including, for example, at least one central processing unit ("CPU" or "processor"), at least one input device (e.g., a mouse, keyboard, controller, touch screen, or keypad), at least one output device (e.g., a display device, printer, or speaker), at least one storage device such as disk drives, optical storage devices, and solid-state storage devices such as random access memory ("RAM") or read-only memory ("ROM"), as well as removable media devices, memory cards, flash cards, etc., and various combinations thereof.

In an embodiment, such a device also includes a computer-readable storage media reader, a communications device (e.g., a modem, a network card (wireless or wired), an infrared communication device, etc.), and working memory as described above where the computer-readable storage media reader is connected with, or configured to receive, a computer-readable storage medium, representing remote, local, fixed, and/or removable storage devices as well as storage media for temporarily and/or more permanently containing, storing, transmitting, and retrieving computer-readable information. In an embodiment, the system and various devices also typically include a number of software applications, modules, services, or other elements located within at least one working memory device, including an operating system and application programs, such as a client application or web browser. In an embodiment, customized hardware is used and/or particular elements are implemented in hardware, software (including portable software, such as applets), or both. In an embodiment, connections to other computing devices such as network input/output devices are employed.

In an embodiment, storage media and computer readable media for containing code, or portions of code, include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed but, on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood within the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media, and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, in an embodiment, a non-transitory computer-readable storage medium stores instructions and a main CPU executes some of the instructions while a graphics processor unit executes other instructions. In another embodiment, different components of a computer system have separate processors and different processors execute different subsets of the instructions.

Accordingly, in an embodiment, computer systems are configured to implement one or more services that singly or collectively perform operations of processes described herein, and such computer systems are configured with applicable hardware and/or software that enable the performance of the operations. Further, a computer system, in an embodiment of the present disclosure, is a single device and, in another embodiment, is a distributed computer system comprising multiple devices that operate differently such that the distributed computer system performs the operations described herein and such that a single device does not perform all operations.

The use of any and all examples or exemplary language (e.g., "such as") provided herein is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references including publications, patent applications, and patents cited herein are hereby incorporated by reference to the same extent as if each reference were individually and specifically indicated to be incorporated by reference and were set forth in its entirety herein.

What is claimed is:

1. A computer-implemented method, comprising:
    dividing a frame of image data into a plurality of blocks of pixels;
    analyzing a first block of pixels of the plurality of block of pixels to determine whether the first block of pixels contains at least one edge;
    select a type of compression to compress the first block of pixels with based on whether the block of pixels contains the at least one edge, wherein the type of compression is selected from a group comprising lossy compression corresponding to the first block of pixels including no edges and lossless compression corresponding to the first block of pixels including the at least one edge;
    obtaining at least one first value associated with at least one second block of pixels adjacent to the first block of pixels, wherein the at least one first value comprises pixel values associated with the at least one second block of pixels;
    compressing the first block of pixels using the selected type of compression and based on the at least one first value to yield at least one compressed value, wherein the at least one second block of pixels is compressed separately from the first block of pixels;
    setting at least one second value associated with the first block of pixels to indicate the type of compression used to compress the first block of pixels; and
    encoding the at least one compressed value to produce encoding image data.

2. The computer-implemented method of claim 1, further comprising:
    determining the type of compression used for the at least one second block of pixels based on at least one indicator associated with the second block of pixels; and
    using a default value for the at least one first value when the type of compression of the second block of pixels is different than the type of compression selected for the first block of pixels.

3. The computer-implemented method of claim 1, wherein
    selecting the type of compression comprises selecting lossy compression, wherein the at least one first value comprises a first direct current (DC) component of a pixel block in a previous row of the plurality of blocks of pixels and a second DC component of a pixel block in a previous column of the plurality of blocks of pixels; and
    wherein setting the at least one second value associated with the first block of pixels comprises subtracting the first or second DC component from the at least one compressed value.

4. The computer-implemented method of claim 1, wherein:
    selecting the type of compression comprises selecting lossless compression, wherein the at least one first value comprises at least one of first pixel values from a first adjacent block of pixels, second pixel values from a second adjacent block of pixels, or third pixel values from a third adjacent block of pixels;
    compressing the first block of pixels comprises using the least one of the first pixel values, second pixel values or third pixel values to determine residual values for the first block of pixels; and
    setting at least one second value associated with the first block of pixels comprises setting at least one Boolean flag to indicate that the first block of pixels was compressed using lossless compression.

5. A system, comprising:
one or more processors;
memory that stores computer-executable instructions that, if executed, cause the system to:
  determine whether a first block of pixels of a plurality of block of pixels comprising a first frame of image data contains at least one edge;
  select, based on whether the block of pixels contains the at least one edge, a type of compression from a plurality of compression types that includes lossy compression and lossless compression;
  obtain at least one first value associated with at least one second block of pixels adjacent to the first block of pixels, wherein the at least one first value comprises pixel values associated with the at least one second block of pixels;
  compress the first block of pixels based on the at least one first value and using the selected type of compression to yield a compressed block of pixels, wherein the at least one second block of pixels is compressed separately from the first block of pixels; and
  set at least one second value associated with the first block of pixels to indicate at least one of the compressed value or the type of compression used to compress the first block of pixels.

6. The system of claim 5, wherein the computer-executable instructions that, if executed, further cause the system to:
  determine the type of compression used for the at least one second block of pixels based on at least one indicator associated with the second block of pixels; and
  use a sentinel value for the at least one first value when the type of compression of the second block of pixels is different than the type of compression selected for the first block of pixels.

7. The system of claim 5, wherein:
selecting the type of compression comprises selecting lossy compression,
the at least one first value comprises a first pixel value of a pixel block in a previous row of the plurality of blocks of pixels and a second pixel value of a pixel block in a previous column of the plurality of blocks of pixels, and
the computer-executable instructions that, if executed, further cause the system to: update the at least one first value by subtracting the first or second pixel values from the at least one compressed value.

8. The system of claim 7, wherein the first pixel value comprises a first spatial frequency amplitude and the second pixel value comprises a second spatial frequency amplitude.

9. The system of claim 7, wherein the first pixel value comprises at least one first color value and the second pixel value comprises at least one second color value.

10. The system of claim 7, wherein setting the first pixel value and the second pixel value to zero indicates that the adjacent block was compressed using lossless compression.

11. The system of claim 5, wherein:
selecting the type of compression comprises selecting lossless compression,
the at least one first value comprises at least one of first pixel values from a first adjacent block of pixels, second pixel values from a second adjacent block of pixels, or third pixel values from a third adjacent block of pixels,
the computer-executable instructions that causes the system to compress the first block of pixels using the selected type of compression to yield at least one compressed value comprises instructions that further cause the system to use the at least one of the first pixel values, the second pixels values, or the third pixels values to determine the at least one compressed value, and
the computer-executable instructions that, if executed, further cause the system to: update the at least one first value by setting at least one Boolean flag to indicate that the first block of pixels was compressed using lossless compression.

12. The system of claim 5, wherein the computer-executable instructions that, if executed, further cause the system to insert the at least one second value into a bit stream that comprises the compressed block of pixels.

13. The system of claim 5, further comprising: decompressing the at least one compressed value to generate the image data.

14. The system of claim 13, wherein the first block of pixels is compressed using lossy compression, and wherein the computer-executable instructions that, if executed, further cause the system to:
  determine that pixel values for the first block of pixels in a subsequent frame of the image data have changed relative to corresponding pixel values for the first block of pixels in the first frame of the image data; and
  based on the determining, recompress the first block of pixels using lossless compression for the subsequent frame of the image data.

15. A non-transitory computer-readable storage medium storing thereon executable instructions that, as a result of being executed by one or more processors of a computer system, cause the computer system to at least:
  obtain a compressed block of pixels of compressed image data;
  obtain at least one first indicator for the compressed block of pixels, the indicator specifying a type of compression used to compress the compressed block of pixels, wherein the type of compression is from a set of compression types that includes lossy compression and lossless compression;
  obtain at least one value for at least one pixel block adjacent to the compressed block of pixels, wherein the at least one first value comprises compressed pixel values associated with the at least one pixel block adjacent to the compressed block of pixels; and
  based on the first indicator and the at least one value, decompress the compressed block of pixels to produce a decompressed block of pixels, the decompressed block of pixels comprising part of the image data.

16. The non-transitory computer-readable storage medium of claim 15, wherein the instructions further comprise instructions that, as a result of being executed by the one or more processors, cause the computer system to:
  set a second indicator for the decompressed block of pixels, the second indicator specifying a validity of values for the type of compression used on the compressed block of pixels.

17. The non-transitory computer-readable storage medium of claim 16, wherein the first indicator specifies lossy compression, and wherein the instructions further comprise instructions that, as a result of being executed by the one or more processors, cause the computer system to set the second indicator to specify lossy compression for the decompressed block of pixels.

18. The non-transitory computer-readable storage medium of claim 16, wherein setting the second indicator comprises setting at least one Boolean flag associated with the block of pixels to false.

19. The non-transitory computer-readable storage medium of claim 16, wherein the first indicator specifies lossless compression, and wherein the instructions further comprise instructions that, as a result of being executed by the one or more processors, cause the computer system to: set the second indicator to specify lossless compression for the decompressed block of pixels.

20. The non-transitory computer-readable storage medium of claim 19, wherein setting the second indicator comprises setting at least one Boolean flag associated with the block of pixels to true and setting at least one of a prior row value or a prior column value to zero.

21. The non-transitory computer-readable storage medium of claim 16, wherein the instructions further comprise instructions that, as a result of being executed by the one or more processors, cause the computer system to:
  determine the type of compression used for the at least one adjacent pixel block based on at least one first indicator associated with the second block of pixels;
  use a sentinel value for the at one second indicator upon determining that the type of compression of the second block of pixels is different than the type of compression indicated by the first indicator for the compressed block of pixels.

22. The non-transitory computer-readable storage medium of claim 15, wherein the at least one first indicator is stored in the compressed image data.

23. The non-transitory computer-readable storage medium of claim 16, wherein the instructions further comprise instructions that, as a result of being executed by the one or more processors, cause the computer system to: set the at least one second indicator based on pixel values associated with the decompressed block of pixels.

* * * * *